(12) United States Patent
Yamazaki et al.

(10) Patent No.: US 7,635,863 B2
(45) Date of Patent: Dec. 22, 2009

(54) DISPLAY DEVICE AND ELECTRONIC APPARATUS HAVING THE DISPLAY DEVICE

(75) Inventors: Shunpei Yamazaki, Tokyo (JP); Mitsuaki Osame, Atsugi (JP); Tomoyuki Iwabuchi, Yokosuka (JP); Kei Takahashi, Kanagawa (JP); Ryo Nozawa, Sapporo (JP); Mizuki Sato, Kanagawa (JP); Ryota Fukumoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 193 days.

(21) Appl. No.: 11/548,079

(22) Filed: Oct. 10, 2006

(65) Prior Publication Data

US 2007/0194314 A1    Aug. 23, 2007

(30) Foreign Application Priority Data

Oct. 18, 2005    (JP)    ............................ 2005-303747

(51) Int. Cl.
    *H01L 27/15*    (2006.01)
(52) U.S. Cl. ............................ 257/59; 257/72; 257/82; 257/E27.132
(58) Field of Classification Search .................... 257/59, 257/72, 82, 88, 89
    See application file for complete search history.

(56) References Cited

U.S. PATENT DOCUMENTS

| | | | |
|---|---|---|---|
| 6,518,941 B1 | 2/2003 | Kimura | |
| 6,528,951 B2 | 3/2003 | Yamazaki et al. | |
| 6,774,574 B1 | 8/2004 | Koyama | |
| 2001/0033252 A1 | 10/2001 | Yamazaki et al. | |
| 2002/0005696 A1 | 1/2002 | Yamazaki et al. | |
| 2002/0140364 A1 | 10/2002 | Inukai | |
| 2002/0153844 A1 | 10/2002 | Koyama | |
| 2003/0071772 A1 | 4/2003 | Kimura | |
| 2003/0132716 A1 | 7/2003 | Yamazaki et al. | |
| 2003/0189410 A1 | 10/2003 | Yamazaki et al. | |
| 2004/0207331 A1 | 10/2004 | Koyama | |
| 2004/0263508 A1 | 12/2004 | Koyama et al. | |
| 2005/0012731 A1 | 1/2005 | Yamazaki et al. | |
| 2005/0017963 A1 | 1/2005 | Yamazaki et al. | |
| 2005/0017964 A1 | 1/2005 | Yamazaki et al. | |
| 2005/0024303 A1 | 2/2005 | Kimura et al. | |
| 2005/0122349 A1 | 6/2005 | Yamazaki et al. | |
| 2005/0139834 A1* | 6/2005 | Park et al. | ...................... 257/72 |
| 2005/0285823 A1 | 12/2005 | Kimura et al. | |
| 2006/0022206 A1* | 2/2006 | Hayakawa et al. | ............ 257/82 |

(Continued)

FOREIGN PATENT DOCUMENTS

EP    0 949 603 A1    10/1999

(Continued)

*Primary Examiner*—Wai-Sing Louie
*Assistant Examiner*—Tifney L Skyles
(74) *Attorney, Agent, or Firm*—Fish & Richardson P.C.

(57) ABSTRACT

A light-emitting element has a property that a resistance value (internal resistance) changes in accordance with an environmental temperature. It is an object to downsize a monitoring element which corrects an influence of variations in current value of the light-emitting element, which are caused by an environmental temperature change and a change with time. A pixel includes a plurality of sub-pixels, areas of light-emitting elements provided in the individual sub-pixels are made to be different from each other, and an area of a monitoring element is made to be the same as an area of the light-emitting element in any of the sub-pixels, thereby correcting light-emission of the pixel by the monitoring element.

12 Claims, 30 Drawing Sheets

U.S. PATENT DOCUMENTS

| | | |
|---|---|---|
| 2006/0038804 A1 | 2/2006 | Hayakawa et al. |
| 2006/0055631 A1* | 3/2006 | Yoshida ........................ 345/46 |
| 2007/0216610 A1* | 9/2007 | Smith .......................... 345/76 |

FOREIGN PATENT DOCUMENTS

| | | |
|---|---|---|
| EP | 1 063 630 A2 | 12/2000 |
| EP | 1 168 291 A2 | 1/2002 |
| JP | 11-073158 | 3/1999 |
| JP | 2001-005426 | 1/2001 |
| JP | 2001-184015 | 7/2001 |
| JP | 2002-072964 | 3/2002 |

* cited by examiner

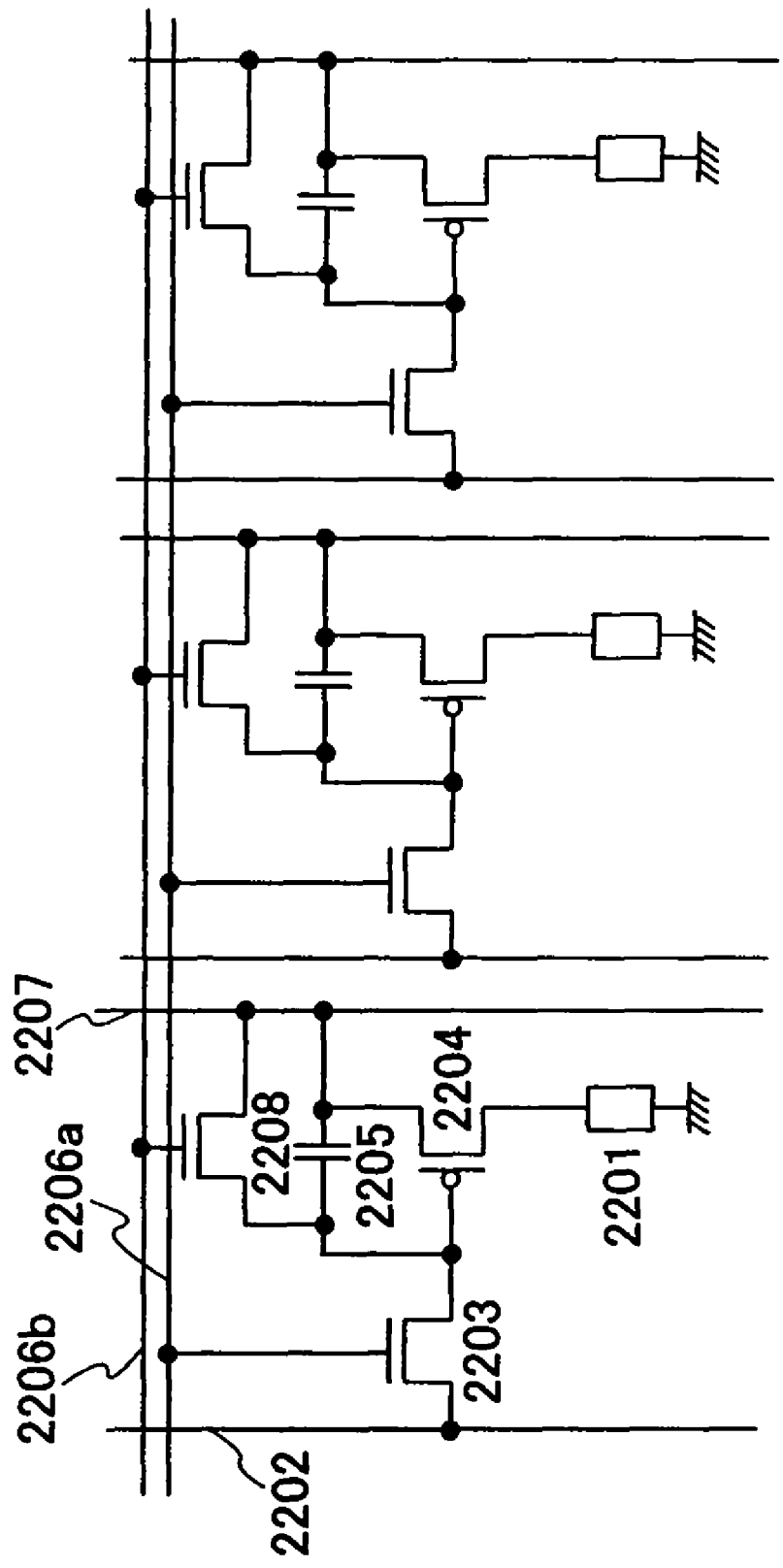

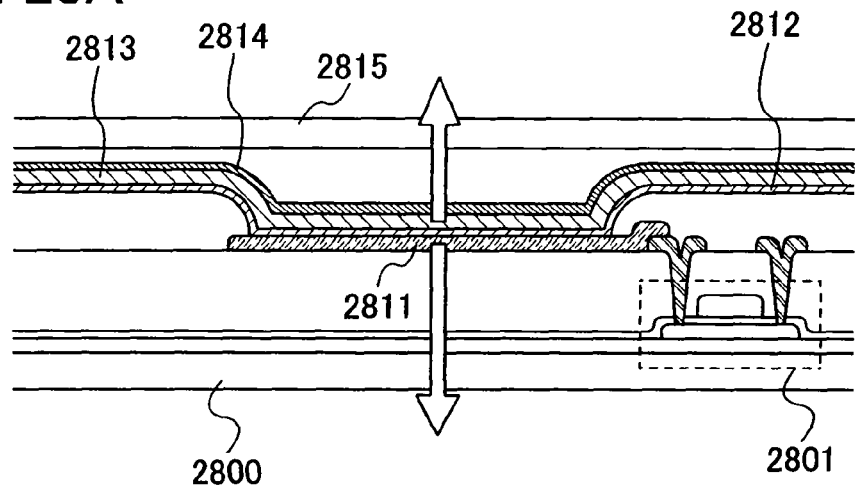
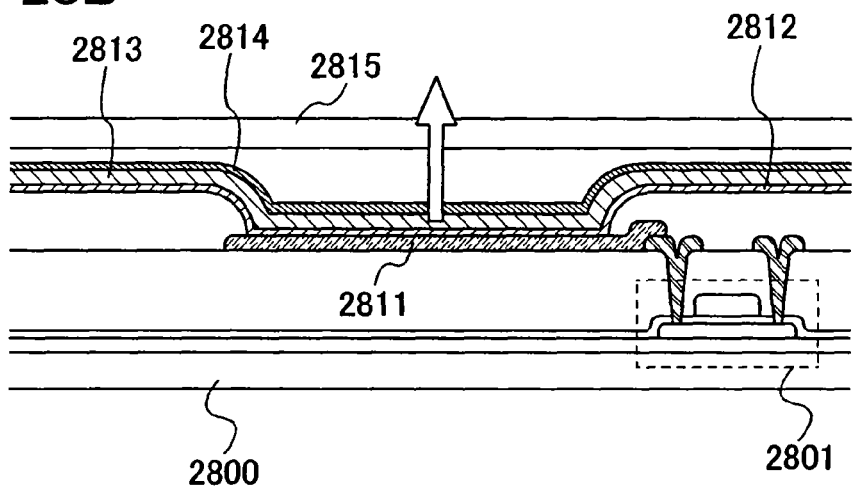
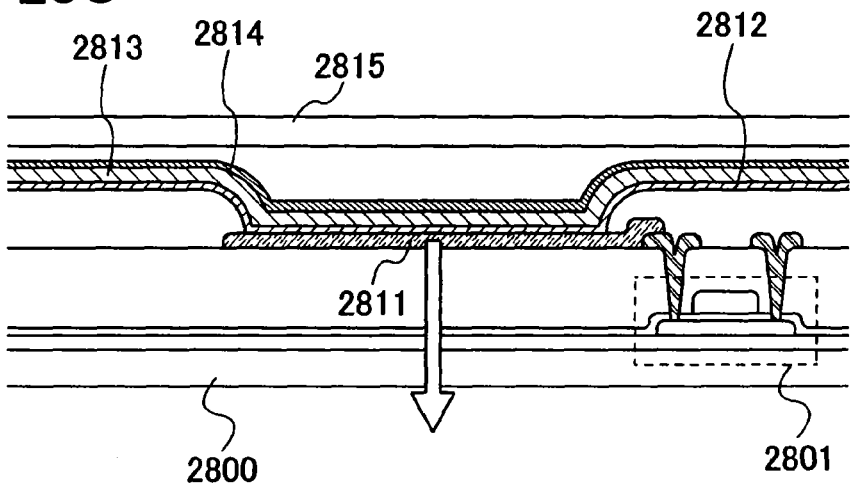

DISPLAY DEVICE AND ELECTRONIC APPARATUS HAVING THE DISPLAY DEVICE

BACKGROUND OF THE INVENTION

1. Field of the Invention

The present invention relates to a display device, in particular, a display device including light-emitting elements arranged in active-matrix. In addition, the present invention relates to an electronic apparatus provided with the display device.

2. Description of the Related Art

In recent years, demands for thin displays mainly applied to TVs, PC monitors, mobile terminals, and the like have rapidly increased and further development has been promoted. The thin displays include a liquid crystal display device (LCD) and a display device equipped with a light-emitting element. In particular, an active matrix display using a light-emitting element is expected as a next-generation display for its features of high response speed, wide viewing angle, and the like in addition to advantages of a conventional LCD, such as thinness, lightness in weight, and high image quality and has been partially put in practical use.

The light-emitting element is also referred to as an organic light-emitting diode (OLED) and includes an anode, a cathode, and a layer which emits light (hereinafter referred to as an electroluminescent layer) when applying an electric field between the anode and the cathode, the layer including an organic compound or an inorganic compound between the anode and the cathode. An amount of a current flowing to the light-emitting element and luminance of the light-emitting element are in a predetermined relation, and the light-emitting element emits light at luminance corresponding to the amount of the current flowing to the electroluminescent layer.

However, a light-emitting element has a property that a resistance value (internal resistance) changes in accordance with an ambient temperature (hereinafter referred to as an environmental temperature). Specifically, with a room temperature set as a normal temperature, when the environmental temperature becomes higher than the normal temperature, the resistance value decreases. On the other hand, the resistance value increases when the environmental temperature becomes lower than the normal temperature. Accordingly, when the environmental temperature rises, luminance higher than desired is obtained as a current value increases. Conversely, when the environmental temperature decreases, luminance lower than desired is obtained as a current value decreases. Such a property of a light-emitting element is as shown in a graph indicating a relation between voltage-current characteristics of a light-emitting element and a temperature (see FIG. 30A). Further, a light-emitting element has a property that a current value thereof decreases with time. Such a property of a light-emitting element is as shown in a graph indicating a relation between voltage-current characteristics of a light-emitting element and time (see FIG. 30B).

Due to the properties of the light-emitting element, luminance thereof varies when an environment temperature changes and a change with time occurs. In view of the aforementioned conditions, there is proposed a display device in which an influence of variations in current value of a light-emitting element, which are caused by an environmental temperature change and a change with time, can be suppressed (for example, see Patent Document 1: Japanese Published Patent Application No: 2002-72964).

In the invention disclosed in Patent Document 1, a monitoring element and a light-emitting element provided in a pixel of a display portion are manufactured so as to have the same relation between a voltage applied between both electrodes and a current flowing to the light-emitting element under the same environmental temperature. However, as a pixel size of the display portion increases, the size of the monitoring element is also necessary to be increased; therefore, there is a problem of interrupting downsizing of a display panel.

SUMMARY OF THE INVENTION

In view of the foregoing problems, it is an object of the present invention to provide a display device in which an influence of variations in current value of a light-emitting element, which are caused by an environmental temperature change and a change with time, can be suppressed and which can be designed without upsizing a monitoring element when a pixel size of a display portion is increased.

According to one feature of the present invention, a display device includes a pixel including a plurality of sub-pixels each having a light-emitting element provided with a first electrode and a second electrode; a transistor driving the light-emitting element; a monitoring element provided with a first electrode and a second electrode; a current source supplying a current to the monitoring element; and a buffer amplifier, where the first electrode of the monitoring element and the first electrode of the light-emitting element are connected to a power supply line; where the second electrode of the monitoring element is connected to an input terminal of the buffer amplifier, and the second electrode of the light-emitting element is connected to an output terminal of the buffer amplifier through the transistor; where areas of a plurality of the light-emitting elements are different depending on the sub-pixel; and where an area of the monitoring element is almost the same as an area of any one of the light-emitting elements.

According to another feature of the present invention, a display device includes a pixel including a plurality of sub-pixels each having a light-emitting element provided with a first electrode and a second electrode; a transistor driving the light-emitting element; a monitoring element provided with a first electrode and a second electrode; a current source supplying a current to the monitoring element; a capacitor element holding a potential of the second electrode of the monitoring element; a first switch conducting or not conducting the capacitor element and the current source; a second switch conducting or not conducting the current source and the monitoring element; and a buffer amplifier, where the first electrode of the monitoring element and the first electrode of the light-emitting element are connected to a power supply line; where the second electrode of the monitoring element is connected to an input terminal of the buffer amplifier, and the second electrode of the light-emitting element is connected to an output terminal of the buffer amplifier through the transistor; where areas of a plurality of the light-emitting elements are different depending on the sub-pixel; and where an area of the monitoring element is almost the same as an area of any one of the light-emitting elements.

According to another feature of the present invention, a display device includes a pixel including a plurality of sub-pixels each having a light-emitting element provided with a first electrode and a second electrode; a transistor driving the light-emitting element; a monitoring element provided with a first electrode and a second electrode; a current source supplying a current to the monitoring element; and a buffer amplifier, where the first electrode of the monitoring element and the first electrode of the light-emitting element are connected to a power supply line; where the second electrode of the monitoring element is connected to an input terminal of the buffer amplifier, and the second electrode of the light-emitting element is connected to an output terminal of the buffer amplifier through the transistor; where, in the plurality of sub-pixels, areas of a plurality of the light-emitting elements are related by a geometric progression with a geometric ratio 2; and where an area of the monitoring element is almost the same as an area of a light-emitting element with the smallest area among the plurality of light-emitting elements.

According to another feature of the present invention, a display device includes a pixel including a plurality of sub-pixels each having a light-emitting element provided with a first electrode and a second electrode; a transistor driving the light-emitting element; a monitoring element provided with a first electrode and a second electrode; a current source supplying a current to the monitoring element; a capacitor element holding a potential of the second electrode of the monitoring element; a first switch conducting or not conducting the capacitor element and the current source; a second switch conducting or not conducting the current source and the monitoring element; and a buffer amplifier, where the first electrode of the monitoring element and the first electrode of the light-emitting element are connected to a power supply line; where the second electrode of the monitoring element is connected to an input terminal of the buffer amplifier, and the second electrode of the light-emitting element is connected to an output terminal of the buffer amplifier through the transistor; where areas of a plurality of the light-emitting elements are different depending on the sub-pixel; and where an area of the monitoring element is almost the same as an area of a light-emitting element with the smallest area among the light-emitting elements.

According to another feature of the present invention, a display device includes a pixel including a plurality of sub-pixels each having a light-emitting element provided with a first electrode and a second electrode; a transistor driving the light-emitting element; a monitoring element provided with a first electrode and a second electrode; a current source supplying a current to the monitoring element; and a buffer amplifier, where the first electrode of the monitoring element and the first electrode of the light-emitting element are connected to a power supply line; where the second electrode of the monitoring element is connected to an input terminal of the buffer amplifier, and the second electrode of the light-emitting element is connected to an output terminal of the buffer amplifier through the transistor; where light-emission intensities of a plurality of the light-emitting elements are different depending on the sub-pixel; and where a light-emission intensity of the monitoring element is almost the same as a light-emission intensity of any one of the light-emitting elements.

According to another feature of the present invention, a display device includes a pixel including a plurality of sub-pixels each having a light-emitting element provided with a first electrode and a second electrode; a transistor driving the light-emitting element; a monitoring element provided with a first electrode and a second electrode; a current source supplying a current to the monitoring element; a capacitor element holding a potential of the second electrode of the monitoring element; a first switch conducting or not conducting the capacitor element and the current source; a second switch conducting or not conducting the current source and the monitoring element; and a buffer amplifier, where the first electrode of the monitoring element and the first electrode of the light-emitting element are connected to a power supply line; where the second electrode of the monitoring element is connected to an input terminal of the buffer amplifier, and the second electrode of the light-emitting element is connected to an output terminal of the buffer amplifier through the transistor; where light-emission intensities of a plurality of the light-emitting elements are different depending on the sub-pixel; and where a light-emission intensity of the monitoring element is almost the same as a light-emission intensity of any one of the light-emitting elements.

According to another feature of the present invention, a display device includes a pixel including a plurality of sub-pixels each having a light-emitting element provided with a first electrode and a second electrode; a transistor driving the light-emitting element; a monitoring element provided with a first electrode and a second electrode; a current source supplying a current to the monitoring element; and a buffer amplifier, where the first electrode of the monitoring element and the first electrode of the light-emitting element are connected to a power supply line; where the second electrode of the monitoring element is connected to an input terminal of the buffer amplifier, and the second electrode of the light-emitting element is connected to an output terminal of the buffer amplifier through the transistor; where, in the plurality of sub-pixels, light-emission intensities of a plurality of the light-emitting elements are related by a geometric progression with a geometric ratio 2; and where a light-emission intensity of the monitoring element is almost the same as a light-emission intensity of a light-emitting element with the lowest light-emission intensity among the plurality of light-emitting elements.

According to another feature of the present invention, a display device includes a pixel including a plurality of sub-pixels each having a light-emitting element provided with a first electrode and a second electrode; a transistor driving the light-emitting element; a monitoring element provided with a first electrode and a second electrode; a current source supplying a current to the monitoring element; a capacitor element holding a potential of the second electrode of the monitoring element; a first switch conducting or not conducting the capacitor element and the current source; a second switch conducting or not conducting the current source and the monitoring element; and a buffer amplifier, where the first electrode of the monitoring element and the first electrode of the light-emitting element are connected to a power supply line; where the second electrode of the monitoring element is connected to an input terminal of the buffer amplifier, and the second electrode of the light-emitting element is connected to an output terminal of the buffer amplifier through the transistor; where light-emission intensities of a plurality of the light-emitting elements are different depending on the sub-pixel; and where a light-emission intensity of the monitoring element is almost the same as a light-emission intensity of a light-emitting element with the lowest light-emission intensity among the light-emitting elements.

By using a display device according to the present invention, variations in luminance due to variations in current value of a light-emitting element, which are caused by an environmental temperature change and a change with time, can be suppressed. Further, in the display device according to the present invention, since it is not necessary to provide a monitoring element into the same size as that of a pixel in a display portion, the monitoring element can be downsized. In addition, by downsizing the monitoring element, downsizing of a display device, in other words, a narrow frame of the display device can be achieved.

BRIEF DESCRIPTION OF THE DRAWINGS

In the accompanying drawings:

FIG. 22 is a circuit diagram of a pixel in a display device according to the present invention;

FIGS. 28A to 28C are cross-sectional views each showing a pixel in a display device according to the present invention;

DESCRIPTION OF THE INVENTION

Figure 1:
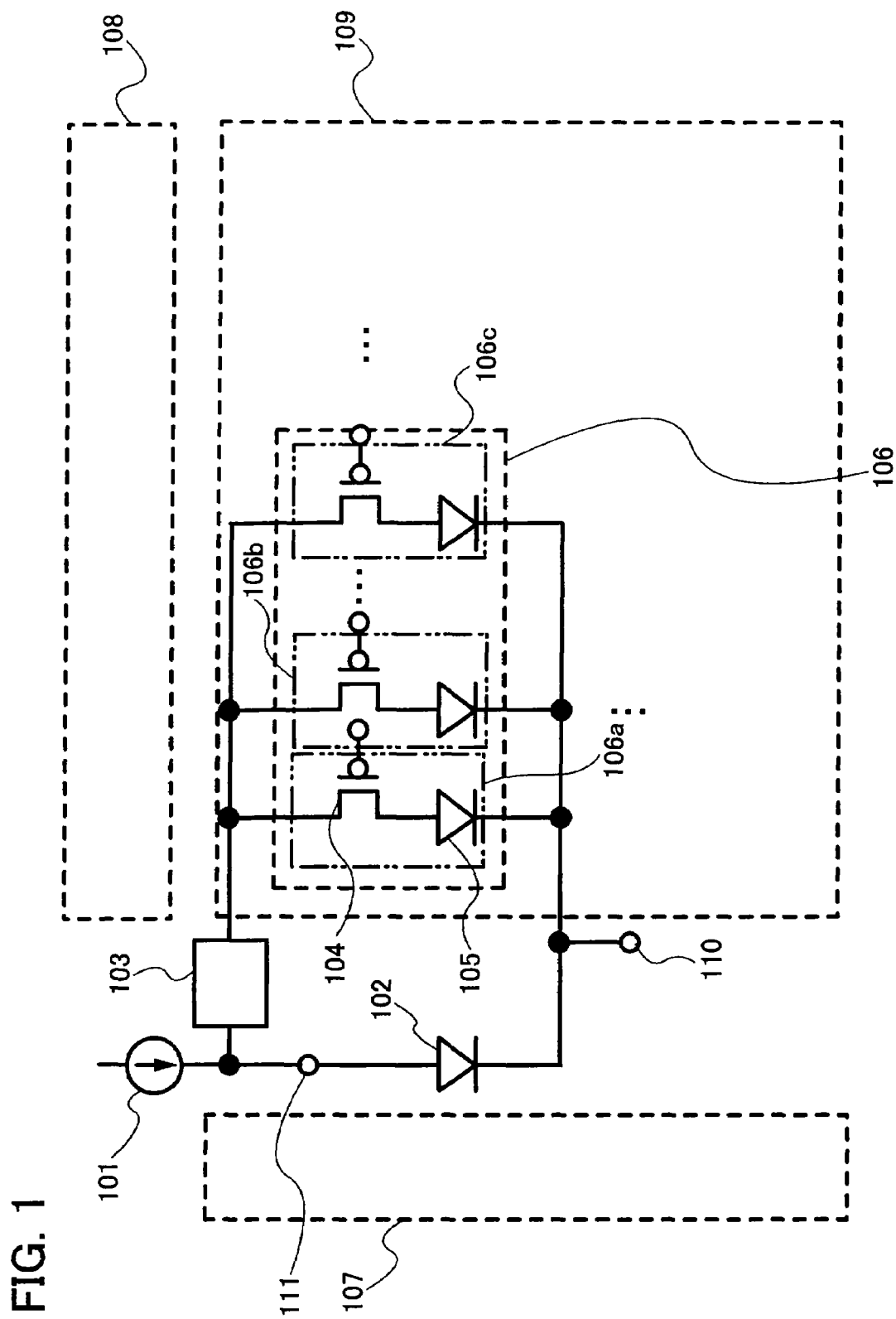
FIG. 1 is a diagram explaining a display device according to the present invention.

Hereinafter, embodiment modes and embodiments of the present invention will be described with reference to the accompanying drawings. It is to be noted that the present invention can be implemented in many various modes, and it is easily understood by those skilled in the art that modes and details thereof can be modified in various ways without departing from the purpose and the scope of the invention. Therefore, the present invention, should not be interpreted as being limited to the description of the embodiment modes and the embodiments. Further, in the following drawings, the same reference numerals are used for the same portions or portions having the same functions and a repeated description thereof will be omitted.

It is to be noted that, in this specification, connected elements are electrically connected to each other. Therefore, the elements can also be connected to each other through a semiconductor element, a switching element, or the like.

In this specification, a source electrode and a drain electrode of a transistor are thus called for convenience in order to distinguish electrodes other than a gate electrode in a configuration of the transistor. In the present invention, in a case where polarity of the transistor is not limited, a source electrode and a drain electrode are changed in name in consideration of the polarity of the transistor. Therefore, a source electrode or a drain electrode is described as one electrode or the other electrode in some cases.

Embodiment Mode 1

This embodiment mode will describe a basic principle of temperature and deterioration compensation in a display device according to the present invention. FIG. 1 shows a schematic diagram of a display device which has a temperature and deterioration compensation circuit.

A display device according to the present invention includes a gate driver 107, a source driver 108, and a pixel portion 109. The pixel portion 109 includes a plurality of pixels 106. In the pixel portion 109, the pixel 106 includes a plurality of sub-pixels 106a, 106b, and 106c. It is to be noted that each of the plurality of sub-pixels is provided with a driving transistor (driving TFT) 104 and a light-emitting element 105. In FIG. 1, the plurality of sub-pixels are formed of three sub-pixels 106a, 106b, and 106c, but the present invention is not limited thereto, and two or more sub-pixels may be provided in one pixel.

In this specification, a pixel includes a color element forming one image and a plurality of sub-pixels each provided with a light-emitting element and an element driving the light-emitting element (such as a circuit including a transistor). Further, in this specification, a picture element includes a pixel provided with a color element for displaying one minimum image. Therefore, in a case of a full-color display device formed of color elements of R (red), G (green), and B (blue), a picture element is formed of pixels including an color element of R, a color element of G, and a color element of B respectively. Further, when a name is given to a sub-pixel in a pixel, the sub-pixel is referred to as a first sub-pixel or a second sub-pixel. Further, the individual sub-pixels are the same or different in area.

A basic configuration of a temperature and deterioration compensation circuit (hereinafter referred to as a compensation circuit) will be described. The compensation circuit includes a current source 101, a monitoring element 102, a buffer amplifier 103, the driving transistor 104, and the light-emitting element 105. It is to be noted that the monitoring element 102 is formed of a light-emitting element which has the same current characteristics as that of the light-emitting element provided in any of the plurality of sub-pixels 106a, 106b, and 106c. For example, in a case where the light-emitting element is formed by using an EL element, an EL element of the monitoring element 102 and an EL element provided in any of the plurality of sub-pixels 106a, 106b, and 106c are manufactured by using the same EL material under the same condition. For example, in this embodiment mode, the light-emitting element of the monitoring element 102 is manufactured by using the same material under the same condition with the same size as the light-emitting element provided in the first sub-pixel. It is to be noted that the same electric characteristics of the monitoring element and the sub-pixel in this specification need not be completely the same characteristics and have only to be roughly the same characteristics. Also, an area of one monitoring element and an area of one of light-emitting elements need not be completely the same and have only to be almost the same in this specification. If a difference between an area of one monitoring element and an area of one of light-emitting elements is within 20%, preferably 5% of the area of the monitoring element, the area of the monitoring element and the area of one of the light-emitting elements can be regarded as almost the same in this specification. Similarly, a light-emission intensity of one monitoring element and a light-emission intensity of one of light-emitting elements need not be completely the same and have only to be almost the same. If a difference between a light-emission intensity of one monitoring element and a light-emission intensity of one of the light-emitting elements is within 20%, preferably 5% of the light-emission intensity of the monitoring element, the light-emission intensity of the monitoring element and the light-emission intensity of one of the light-emitting elements can be regarded as almost the same in this specification.

The current source 101 supplies a constant current to the monitoring element 102. That is, a current value of the monitoring element 102 is always constant. When an environmental temperature changes in this state, a resistance value of the monitoring element 102 itself changes. When the resistance value of the monitoring element 102 changes, a potential difference between both electrodes of the monitoring element 102 changes, because the current value of the monitoring element 102 is constant. By detecting this potential difference between the both electrodes of the monitoring element 102, the change in environmental temperature is detected. More specifically, since a potential of an electrode on a side held at a constant potential of the monitoring element 102, that is, a potential of a cathode 110 does not change in FIG. 1, a change in potential on a side connected to the current source 101, that is, a potential of an anode 111 is detected in FIG. 1.

Figure 26:
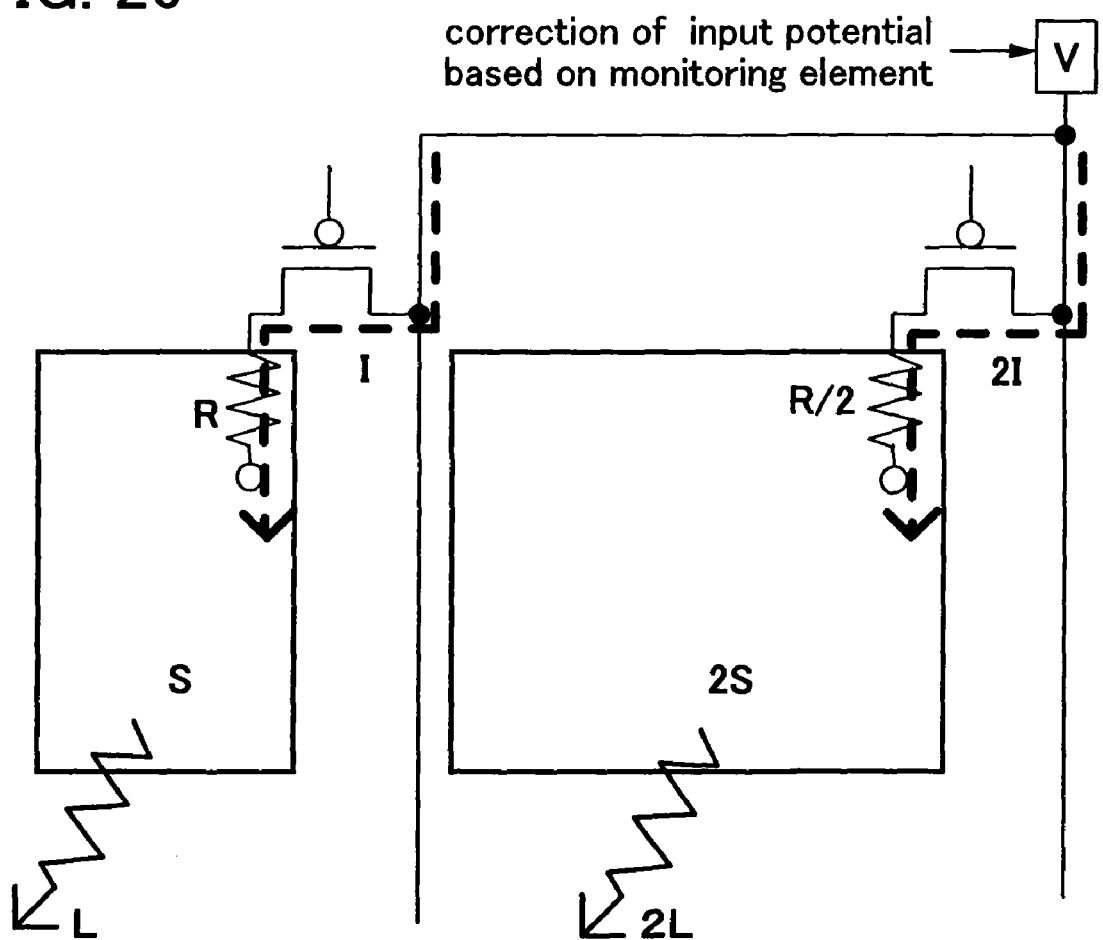
FIG. 26 is a diagram explaining a display device according to the present invention.

Here, circumstances to come up with a configuration, which is different from a conventional configuration, in the display device according to the present invention will be described. The pixel included in the pixel portion of the display device according to the present invention is formed of a plurality of sub-pixels. FIG. 26 shows an example in which a first sub-pixel and a second sub-pixel are provided in a pixel as the plurality of sub-pixels. In the first sub-pixel and the second sub-pixel, an area occupied by a light-emitting element in the first sub-pixel is denoted by S, and an area occupied by a light-emitting element in the second sub-pixel is denoted by 2S which is a double of the area occupied by a light-emitting element in the first sub-pixel. The compensation circuit in the display device according to the present invention can compensate deterioration of the light-emitting element by correcting a potential of a power supply line of the sub-pixel. When the light-emitting elements in the first sub-pixel and the second sub-pixel are to be manufactured by using the same material with the same thickness, resistance values of the light-emitting elements themselves are R in the first sub-pixel and R/2 in the second sub-pixel, respectively. The light-emitting elements in the first sub-pixel and the second sub-pixel are connected to the same power supply line and the same opposing electrode. Therefore, a current I flows to the light-emitting element provided in the first sub-pixel, and a current 2I, which is a double of the current I flown to the first sub-pixel, flows to the light-emitting element provided in the second sub-pixel. Light-emission intensities are determined depending on current density in the light-emitting elements provided in the first and second sub-pixels; accordingly, light-emission intensities of the light-emitting elements in the first and second sub-pixels are proportional to the areas of the light-emitting elements in the first and second sub-pixels. Hence, when the light-emission intensity of the light-emitting element in the first sub-pixel is set to be L, the light-emission intensity in the second sub-pixel is 2 L which is a double of the light-emission intensity L in the first sub-pixel. In other words, as far as a monitoring element, which is manufactured by using the same material under the same condition with the same size as any one of the light-emitting elements provided in the first sub-pixel and the second sub-pixel, is provided in the compensation circuit, a potential of the power supply line of the first sub-pixel and the second sub-pixel can be corrected at the same time. This point that correction is performed based on the monitoring element, which is manufactured by using the same material under the same condition with the same size as any one of the light-emitting elements provided in the first sub-pixel and the second sub-pixel, is a factor to come up with an idea of making the monitoring element smaller than the size of the pixel of the present invention.

Figure 27A:
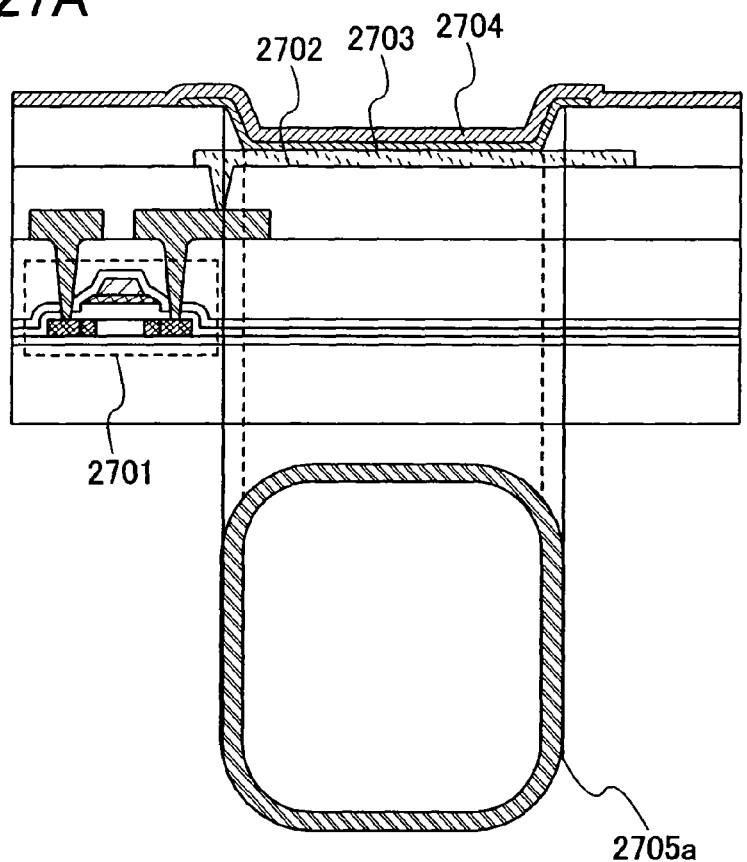
FIGS. 27A and 27B are views each explaining a display device according to the present invention.
Figure 27B:
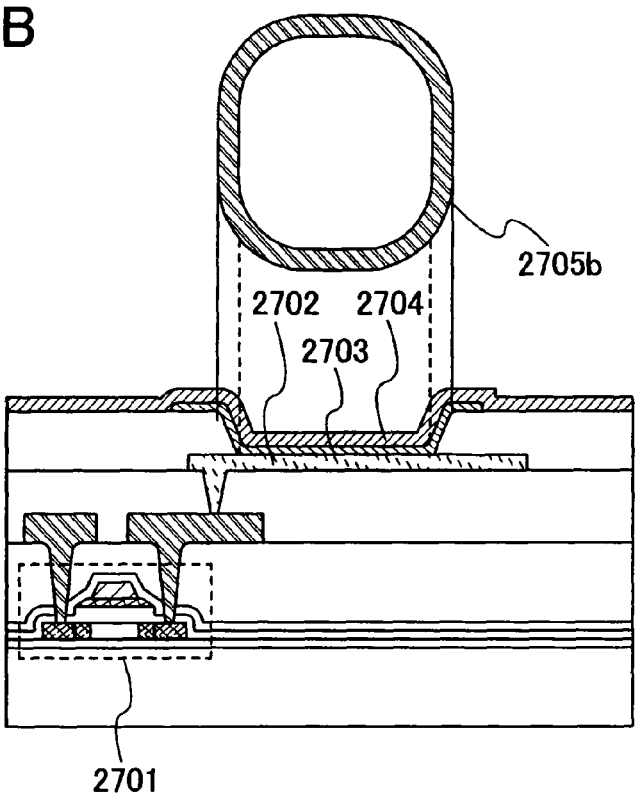

In addition, the present invention has a feature that the monitoring element is downsized as compared with the size of the pixel included in the pixel portion in the display device. Further, it will be described that the idea of the present invention is different from an idea of simply downsizing a light-emitting element in a pixel to form a monitoring element. Basically, in the compensation circuit, a light-emitting element provided in a pixel and a monitoring element are required to be manufactured by using the same material under the same condition with the same size so that they have the same deterioration rate. Here, an example of simply downsizing a light-emitting element in a pixel to form a monitoring element will be described with reference to FIGS. 27A and 27B. In FIGS. 27A and 27B, FIG. 27A shows a light-emitting element provided in a pixel and FIG. 27B shows a monitoring element. Both elements are manufactured by using the same material under the same condition, but the monitoring element is to be smaller than the light-emitting element provided in the pixel. In addition, in each of FIGS. 27A and 27B, a driving transistor 2701, a first electrode 2702, an electroluminescent layer 2703, and a second electrode 2704 are provided. In this specification, the first electrode, the second electrode, and the electroluminescent layer are collectively referred to as a light-emitting element or a monitoring element, simply. Further, in this specification, an area of the light-emitting element and an area of the monitoring element each indicate a region where the first electrode, the electroluminescent layer, and the second electrode are overlapped.

One factor to deteriorate a light-emitting element is moisture or oxygen which enters an electroluminescent layer of the light-emitting element from the outside. Due to moisture or oxygen, a phenomenon in which luminance is deteriorated from an edge of the pixel, which is also referred to as a shrink, is caused in the light-emitting element. It is empirically known that, in portions denoted by reference numerals 2705a and 2705b (referred to as shrink portions) in FIGS. 27A and 27B, a shrink tends to be particularly caused due to a problem such as adhesion of the electroluminescent layer in the light-emitting element. In comparing FIGS. 27A and 27B, it is found that a ratio of a region where a shrink tends to be caused is different depending on the area of the electroluminescent layer in the light-emitting element. In other words, when the area of the light-emitting element in the pixel and the area of the monitoring element are different, degrees of deterioration progression are different due to different sizes of the shrink forming regions. Accordingly, since degrees of deterioration progression of the electroluminescent layer in the light-emitting element in the pixel and the electroluminescent layer in the monitoring element are different, deterioration compensation of the light-emitting element becomes difficult. Therefore, in a conventional idea, it is difficult to realize downsizing of the monitoring element simply.

It is preferable that the areas of the light-emitting elements in the first sub-pixel and the second sub-pixel be related by a geometric progression with a geometric ratio 2 as shown in FIG. 26 because a gradation 2×2=4 can be displayed by the combination of the areas of the light-emitting elements. It is also preferable that areas of light-emitting elements in a plurality of sub-pixels provided in a pixel be related by a geometric progression with a geometric ratio 2 without being limited to two sub-pixels of the first sub-pixel and the second sub-pixel, because a multi-gradation of the display device can be realized by the combination. In other words, it is preferable that light-emission intensities in a plurality of sub-pixels be related by a geometric progression with a geometric ratio 2 because a multi-gradation can be realized. Naturally, it is not always necessary that the areas and the light-emission intensities of the light-emitting elements provided in the plurality of sub-pixels be related by a geometric progression with a geometric ratio 2.

Figure 2:
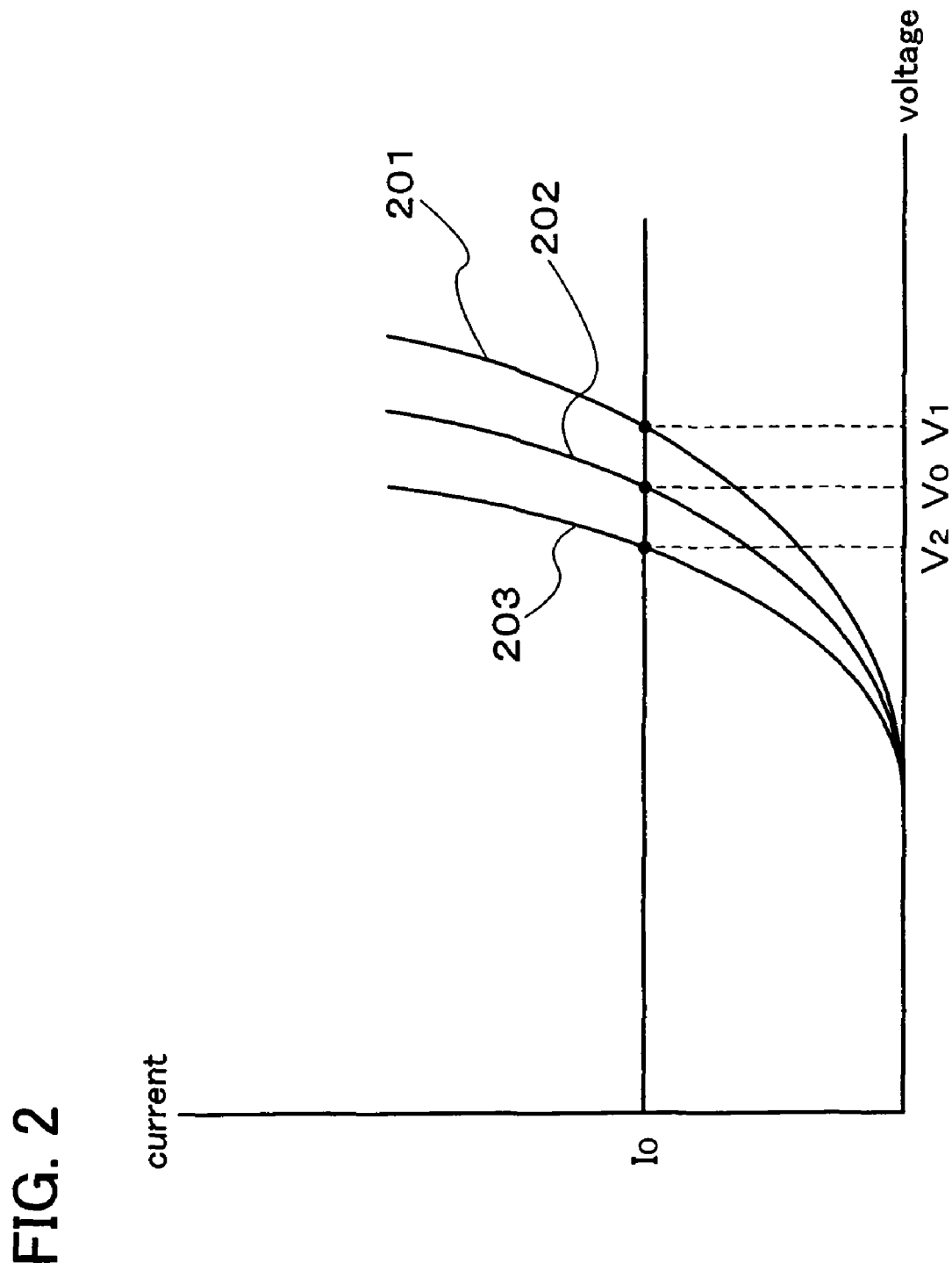
FIG. 2 is a graph explaining temperature dependency of voltage-current characteristics of a monitoring element.

FIG. 2 is a graph showing temperature dependency of voltage-current characteristics of the monitoring element. Voltage-current characteristics of the monitoring element 102 at a low temperature (such as −20° C.), a room temperature (such as 25° C.), and a high temperature (such as 70° C.) are shown by lines 201, 202, and 203 respectively. When a value of a current which flows from the current source 101 to the monitoring element 102 is $I_0$, a voltage of $V_0$ is applied to the monitoring element at a room temperature. Further, a voltage of $V_1$ is applied at a low temperature, and a voltage of $V_2$ is applied at a high temperature.

Information including such variations in voltage of the monitoring element 102 is supplied to the buffer amplifier 103, and a potential supplied to the light-emitting element 105 is set in the buffer amplifier 103 based on the potential of the anode 111. That is, in a case where the environmental temperature is lowered as shown in FIG. 2, the potential is set so that the voltage of $V_1$ is applied to the light-emitting element 105, and in a case of a high temperature, the potential is set so that the voltage of $V_2$ is applied to the light-emitting element 105. Then, a power supply potential to be inputted to the light-emitting element 105 can be corrected in accordance with variations in temperature. In other words, variations in current value, which are resulted from variations in temperature, can be suppressed.

Figure 3:
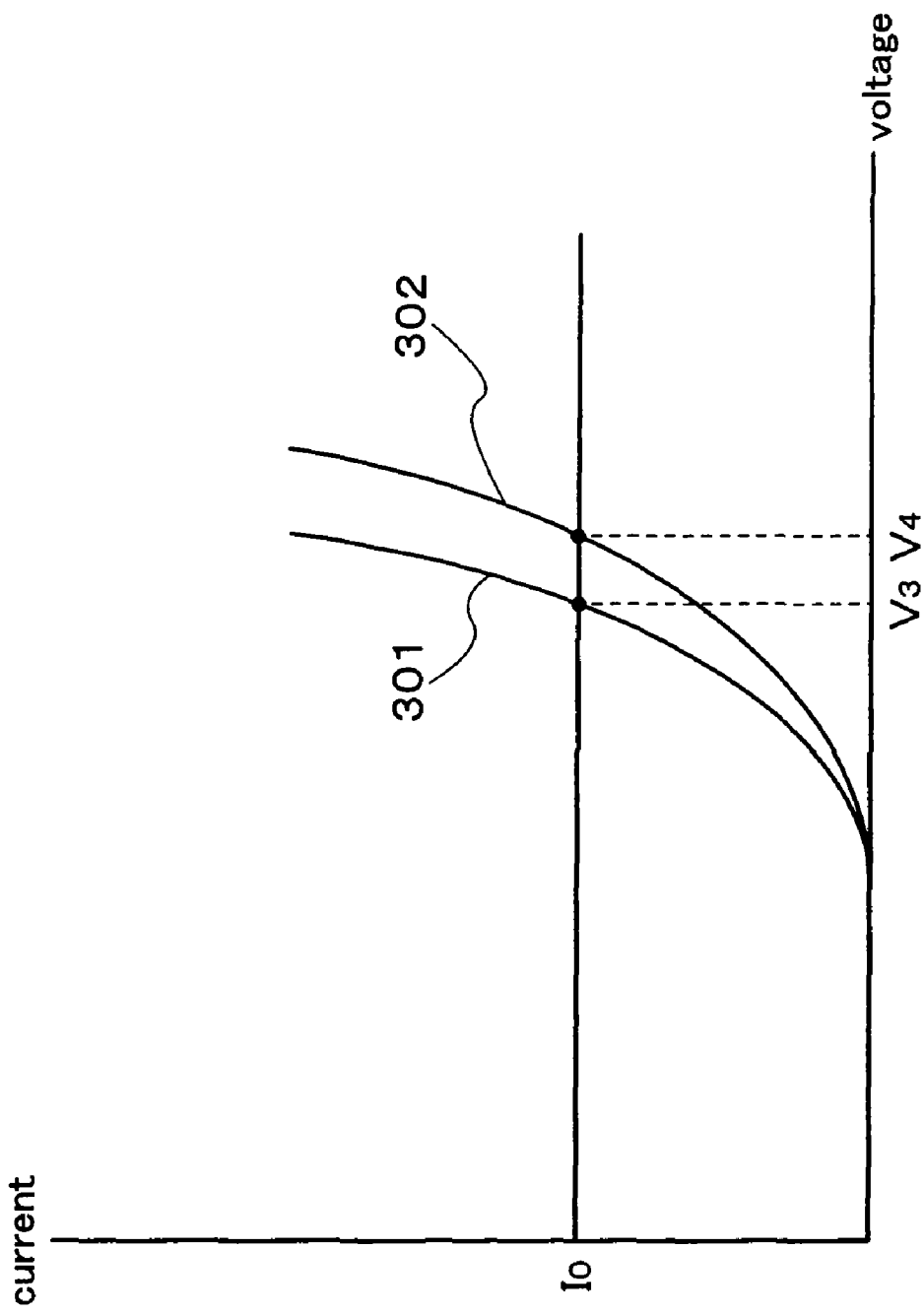
FIG. 3 is a graph explaining deterioration with time of voltage-current characteristics of a monitoring element.

Further, FIG. 3 is a graph showing a change with time of voltage-current characteristics of the monitoring element 102. Initial characteristics of the monitoring element 102 are shown by a line 301, and characteristics after deterioration are shown by a line 302. It is to be noted that the initial characteristics and the characteristics after deterioration are to be measured at the same temperature. When a current $I_0$ flows to the monitoring element 102 in a state of the initial characteristics, a voltage applied to the monitoring element 102 is to be $V_3$, and a voltage applied to the monitoring element 102 after deterioration is to be $V_4$. Therefore, when this voltage of $V_4$ is similarly applied to the light-emitting element 105 that is deteriorated, deterioration of the light-emitting element 105 can be reduced in appearance. Thus, since the monitoring element 102 is also deteriorated together with the light-emitting element 105, deterioration of the light-emitting element 105 can also be compensated.

A voltage follower circuit using an operational amplifier can be applied to the buffer amplifier 103, which applies the same potential as the potential of the anode 111 of the monitoring element 102 to an anode of the light-emitting element 105 in accordance with the potential change of the anode 111 of the monitoring element 102. This is because, since a non-inverting input terminal of the voltage follower circuit has high input impedance and an output terminal has low output impedance, the input terminal and the output terminal are set to have the same potential, and a current can be applied from the output terminal without applying a current of the current source 101 to the voltage follower circuit.

Figure 11:
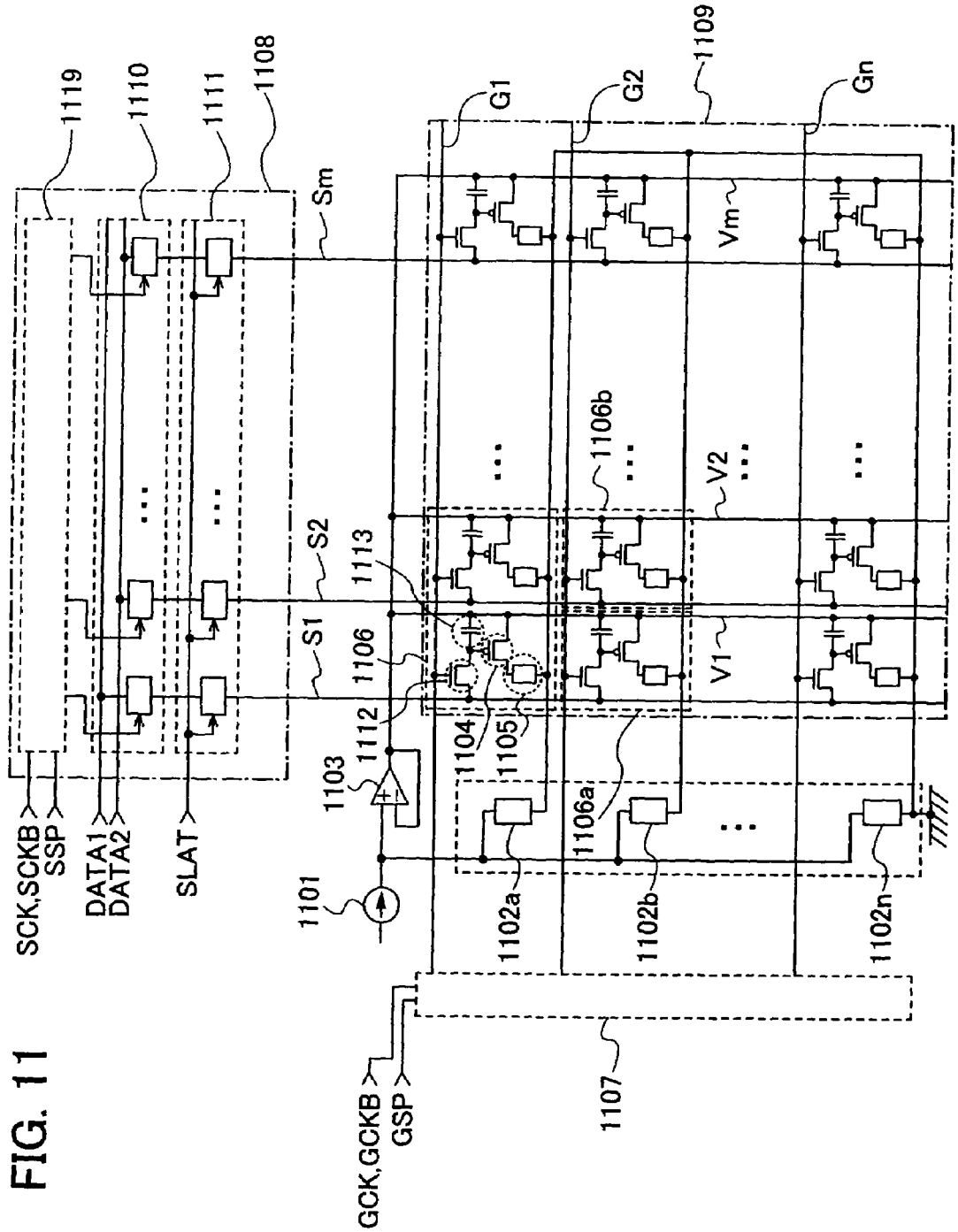
FIG. 11 is a diagram explaining a display device according to the present invention.

A specific configuration of a display device having the compensation circuit of this embodiment mode will be described with reference to FIG. 11. FIG. 11 shows a case where one pixel is formed of a first sub-pixel and a second sub-pixel. The display device includes a gate driver 1107, a source driver 1108, and a pixel portion 1109. A pixel 1106 is provided in the pixel portion, and a first sub-pixel 1106a and a second sub-pixel 1106b each including a switching transistor 1112, a driving transistor 1104, and a light-emitting element 1105 are provided in the pixel 1106. The source driver includes a pulse output circuit 1119, a first latch circuit 1110, and a second latch circuit 1111. While input to the first latch circuit is carried out, output can be carried out in the second latch circuit. Further, the switching transistor 1112 of the pixel 1106 selected by a gate line, to which a signal is inputted from the gate driver 1107, is turned on. Then, a signal outputted from the second latch circuit 1111 is written to a storage capacitor 1113 from each of source signal lines S1 to Sm. The driving transistor 1104 is turned on or off by the signal written to the storage capacitor 1113 so that light-emission or non light-emission of the light-emitting element is determined. That is, a potential of each of power supply lines V1 to Vm is applied to an anode that is a first electrode of the light-emitting element 1105 through the driving transistor 1104 that is turned on, and a current is supplied to the light-emitting element 1105 to emit light.

In the present invention, a current flows from a basic current source 1101 to monitoring elements 1102a to 1102n that are connected in parallel. Potentials of anodes that are first electrodes of the monitoring elements 1102a to 1102n are detected, and potentials of the power supply lines V1 to Vm are set by a voltage follower circuit 1103. Thus, a display device provided with a function of compensating a temperature and deterioration can be provided.

A driving method thus provided with a function of compensating a temperature and deterioration is also referred to as a constant brightness method.

It is to be noted that the number of monitoring elements can be appropriately selected. Needless to say, one monitoring element may be provided, or a monitoring element may be arranged in each row as shown in FIG. 11. Since a current value flowing to the basic current source 1101 may be set to be a current value which is desired to be supplied to the light-emitting element 1105 in each pixel when only one monitoring element is used, power consumption can be small. Further, when a plurality of monitoring elements are arranged, variations in characteristics of individual monitoring elements can be averaged.

It is to be noted that, although a cathode of the light-emitting element 1105 of each pixel is set to be GND in the configuration of FIG. 11, the present invention is not limited thereto.

Figure 12:
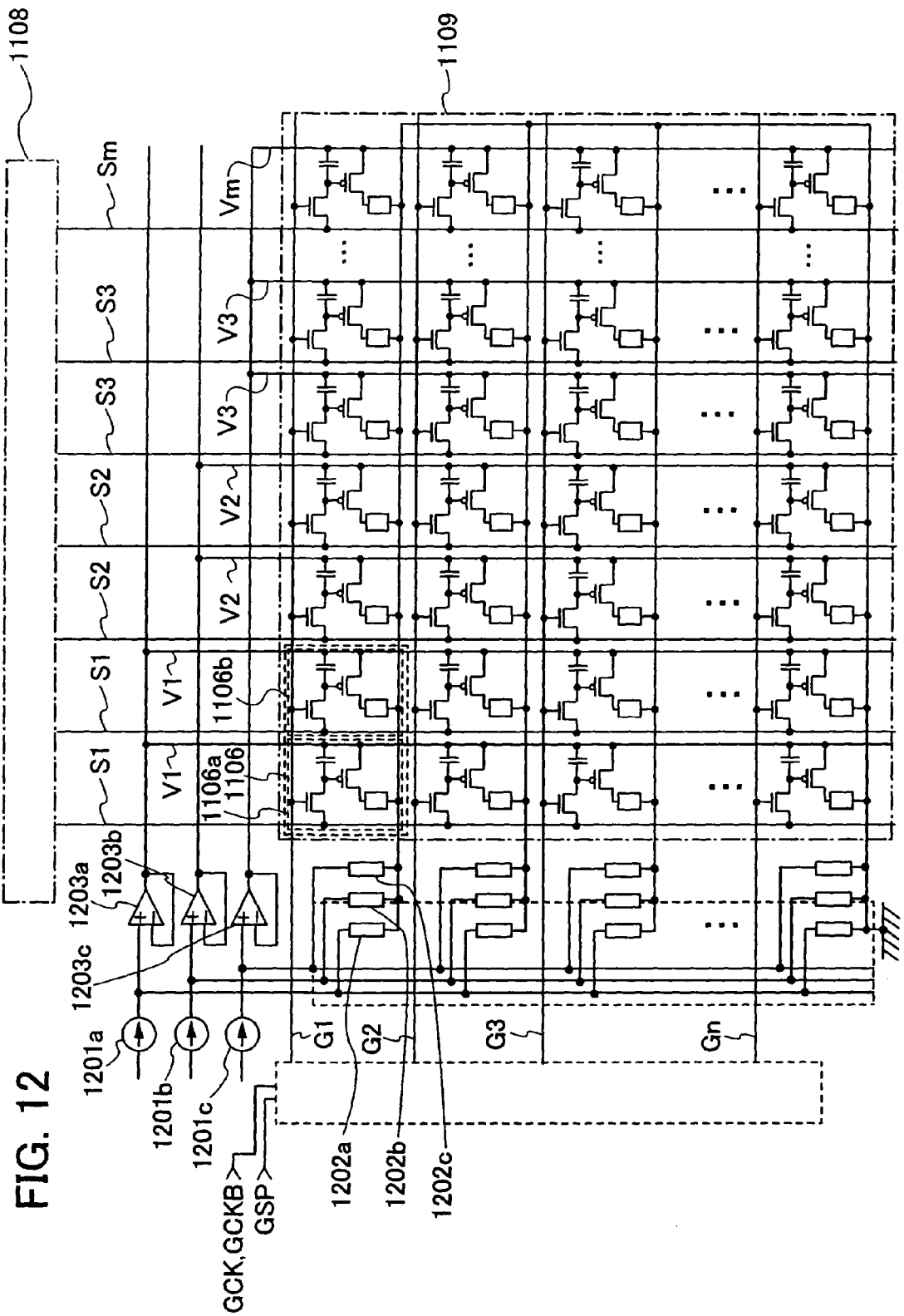
FIG. 12 is a diagram explaining a display device according to the present invention.

Further, a potential of the power supply line can be set for each pixel of R, G, and B. One of the examples is shown in FIG. 12. Common reference numerals are used for the same portions as in the display device in FIG. 11. Further, detailed operation is omitted because it is the same as in FIG. 11.

In a display device of FIG. 12, a pixel connected to a signal line S1 is a pixel which emits light of R, a pixel connected to a signal line S2 is a pixel which emits light of G, and a pixel connected to a signal line S3 is a pixel which emits light of B. A basic current source 1201a supplies a current to a monitoring element 1202a, a voltage follower circuit 1203a detects a potential of an anode of the monitoring element 1202a and the potential is set as a potential of a power supply line $V_1$. A basic current source 1201b supplies a current to a monitoring element 1202b, a voltage follower circuit 1203b detects a potential of an anode of the monitoring element 1202b, and the potential is set as a potential of a power supply line $V_2$. A basic current source 1201c supplies a current to a monitoring element 1202c, a voltage follower circuit 1203c detects a potential of an anode of the monitoring element 1202c, and the potential is set as a potential of a power supply line $V_3$. Thus, a potential can be set for each of R, G, and B. Therefore, for example, when temperature characteristics or deterioration characteristics differ depending on an EL material of R, G, or B, a desired potential can be set for the light-emitting element. That is, a power supply potential can be corrected for each of R, G, and B.

In accordance with this embodiment mode, variations in luminance due to variations in current value of a light-emitting element, which are caused by an environmental temperature change and a change with time, can be suppressed. Further, since it is not necessary to provide a monitoring element into the same size as that of a pixel in a display portion, the monitoring element can be downsized. In addition, by downsizing the monitoring element, downsizing of a display device, in other words, a narrow frame of the display device can be achieved.

It is to be noted that this embodiment mode can be implemented by being freely combined with any description of embodiments and embodiment modes in this specification.

Embodiment Mode 2

This embodiment mode will describe a configuration which is different from that of the display device described in the above embodiment mode. In this embodiment mode, a configuration in which precision of deterioration compensation is further enhanced will be described.

When a display device is continuously used for a long time, a discrepancy is generated in deterioration progression between a monitoring element and a light-emitting element. As the display device is used longer, the discrepancy grows bigger, leading a lowered function of compensating deterioration.

Figure 4:
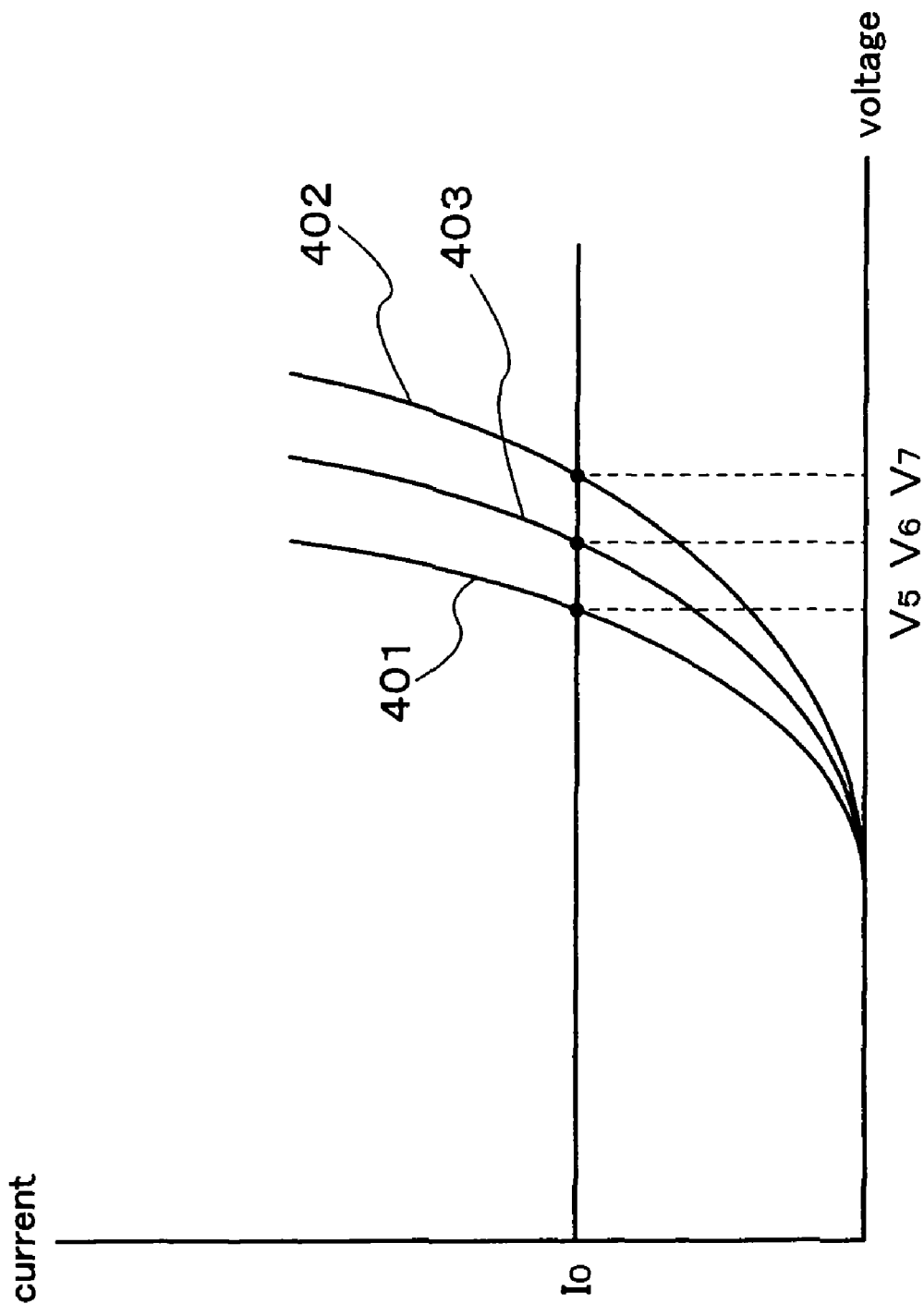
FIG. 4 is a graph explaining deterioration of a monitoring element and a light-emitting element.

Here, description is made on a case where a discrepancy is generated in deterioration progression with reference to FIG. 4. Initial characteristics of voltage-current (VI) characteristics of the monitoring element 102 and the light-emitting element 105 are denoted by a line 401, VI characteristics after deterioration of the monitoring element 102 in a case where the display device is used for a certain period are denoted by a line 402, and VI characteristics after deterioration of the light-emitting element 105 are denoted by a line 403. In such a manner, there is generated a difference in deterioration progression between the monitoring element 102 and the light-emitting element 105. This is because a current always continues to flow to the monitoring element 102 when the display device performs display, but there are a light-emission period and a non light-emission period in each of the light-emitting elements 105 of a pixel. Accordingly, a discrepancy is generated in deterioration with time between the monitoring element 102 and the light-emitting element 105. That is, deterioration progression of the light-emitting element is delayed as compared with deterioration of the monitoring element.

Here, in the initial characteristics of the monitoring element 102, when a current of a current value $I_0$ flows to the monitoring element 102, a voltage of $V_5$ is applied to the monitoring element in the initial characteristics. In addition, after deterioration of the light-emitting element 105, a voltage of $V_6$ is applied, and after deterioration of the monitoring element 102, a voltage of $V_7$ is applied. Conversely, the voltage of $V_6$ is required to be applied in order to apply the current value $I_0$ to the light-emitting element 105 after deterioration, and the voltage of $V_7$ is required to be applied in order to apply the current value $I_0$ to the monitoring element 102 after deterioration.

When the potential $V_7$ of the anode 111 of the monitoring element 102 is detected in this condition and the potential $V_7$ is set for the light-emitting element by the buffer amplifier 103, a voltage of $V_6$ or higher, which is necessary to supply the current value $I_0$ to the light-emitting element, is applied, and power consumption becomes large. Further, since deterioration progression differs from one light-emitting element to another in the pixel, when a voltage higher than required is applied, a screen burn becomes prominent.

In this embodiment mode, deterioration progression of each light-emitting element is set closer to deterioration progression of a monitoring element, thereby improving precision of deterioration compensation.

Therefore, in this embodiment mode, an averaged period of light-emission periods of the light-emitting element in each pixel of the display device is set to be a period during which a current flows to the monitoring element. Preferably, a current flows to the monitoring element during 10 to 70% of a period during which the display device performs display.

Here, it is empirically known that an average value of the ratio of a light-emission period to a non light-emission period of the light-emitting element in each pixel in the display device is 3:7. Therefore, more preferably, a current is supplied to the monitoring element during 30% of the period during which the display device performs display.

Figure 5:
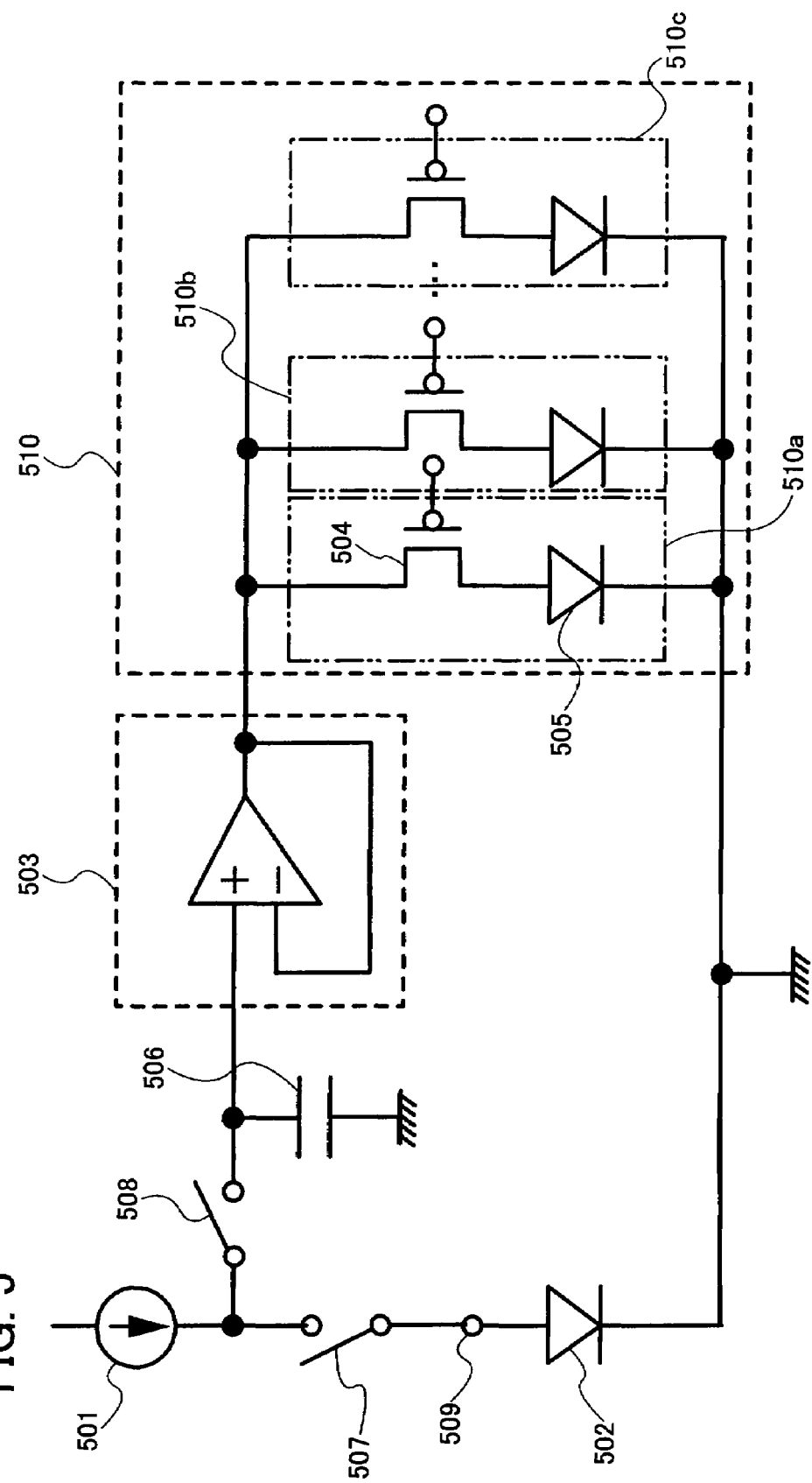
FIG. 5 is a diagram explaining a temperature compensation function according to the present invention.

FIG. 5 shows a configuration of a compensation circuit which can set a light-emission period of a monitoring element. The compensation circuit includes a current source 501, a monitoring element 502, a voltage follower circuit 503, a capacitor element 506, a first switch 507, a second switch 508, and a pixel 510. The pixel 510 includes a plurality of sub-pixels 510a, 510b, and 510c, and each sub-pixel includes a driving transistor 504 and a light-emitting element 505. In FIG. 5, the plurality of sub-pixels are formed of three sub-pixels 510a, 510b, and 510c, but the present invention is not limited thereto and two or more sub-pixels may be provided in one pixel. In addition, similarly to Embodiment Mode 1, in a case where the light-emitting element is formed of an EL element, an EL element of the monitoring element 502 and an EL element provided in any of the plurality of sub-pixels 510a, 510b, and 510c are manufactured by using the same EL material under the same condition. In the display device according to the present invention, the monitoring element is manufactured into the same size as that of the sub-pixel included in the pixel and is not necessary to be provided into the same size as that of the pixel in the display portion. Therefore, the monitoring element can be downsized as compared with the size of the pixel in the display portion.

When a constant current is supplied to the monitoring element 502, the first switch 507 and the second switch 508 are turned on. Then, a current flows to the monitoring element 502, a potential of an anode 509 of the monitoring element 502 is accumulated in the capacitor element 506, the potential is inputted to a non-inverting input terminal of the voltage follower circuit 503, and the same potential is outputted to an output terminal. Thus, a desired potential can be set for the light-emitting element 505 in which voltage-current characteristics are changed by a change in environmental temperature.

When the monitoring element 502 emits no light, the first switch 507 and the second switch 508 are turned off, and the potential of the anode 509 of the monitoring element 502 is held in the capacitor element 506. At this time, the second switch 508 is turned off at the same time as or at least before the first switch 507. If the first switch 507 is turned off before the second switch 508, a potential of the capacitor, in which the potential of the anode of the monitoring element 502 is accumulated, changes.

Thus, also in a non light-emission period, the potential of the anode 509 of the monitoring element 502 at the moment when the second switch 508 is turned off is inputted to the non-inverting input terminal of the voltage follower circuit 503. Then, the same potential is outputted to the output terminal of the voltage follower circuit 503, and a current flowing to the monitoring element 502 at the moment when the second switch 508 is turned off can be supplied to the light-emitting element.

Since a function of compensating a temperature can be achieved in a period during which a current is supplied to the monitoring element in this configuration, both deterioration compensation and temperature compensation can be realized. In this embodiment mode, a function of compensating deterioration is specifically excellent.

Here, it is empirically known that an average value of the ratio of light-emission to non light-emission in each pixel during one frame period is 30:70 in gradation display of the display device. Therefore, it is found that an average ratio of an amount of a current flowing to the monitoring element, which continues to supply a current while display of a display device is performed, to an amount of a current flowing to each light-emitting element is 100:30. Therefore, by setting a period during which a current is supplied to the monitoring element to be 30% per frame period, deterioration progression of the monitoring element can be set closer to deterioration progression of the light-emitting element in the pixel. That is, precision of deterioration compensation can be improved.

Further, in the above mentioned configuration, a monitoring element for compensating deterioration can be provided for each of R, G, and B so that a function of compensating deterioration and a temperature with further-improved precision can be realized. In a case where deterioration progression and operating life of EL differ depending on R, G, or B, or in a case where temperature characteristics of EL elements differ depending on R, G, or B, it is preferable that temperature compensation and deterioration compensation be carried out by providing monitoring elements corresponding to light-emitting elements of R, G, and B respectively. Further, by setting a light-emission period of the monitoring element for each of R, G, and B in accordance with an average value of the ratio (duty ratio) of a light-emission period to a non light-emission period of the light-emitting element of each of R, G, and B, precision of deterioration compensation is further improved. That is, since average values of deterioration progression of the monitoring element and deterioration progression of each light-emitting element are almost equivalent, precision of deterioration compensation is further improved. Further, since an EL material of the same color can be used for the monitoring element, precision of temperature compensation of the light-emitting element can also be improved. Such a configuration can be realized by being applied to the display device shown in FIG. 12.

In accordance with this embodiment mode as described above, by setting a degree of deterioration of a monitoring element in advance, variations in luminance due to variations in current value of a light-emitting element, which are caused by an environmental temperature change and a change with time, can be suppressed. Further, since it is not necessary to provide the monitoring element into the same size as that of a pixel in a display portion, the monitoring element can be downsized. In addition, by downsizing the monitoring element, downsizing of a display device, in other words, a narrow frame of the display device can be achieved.

It is to be noted that this embodiment mode can be implemented by being freely combined with any description of embodiments or embodiment modes in this specification.

Embodiment Mode 3

This embodiment mode will describe a configuration which is different from that of the display device described in the above embodiment modes. In this embodiment mode, a configuration of a display device, in which precision of deterioration compensation is improved while maintaining precision of temperature compensation, will be described with reference to FIG. 6.

Figure 6:
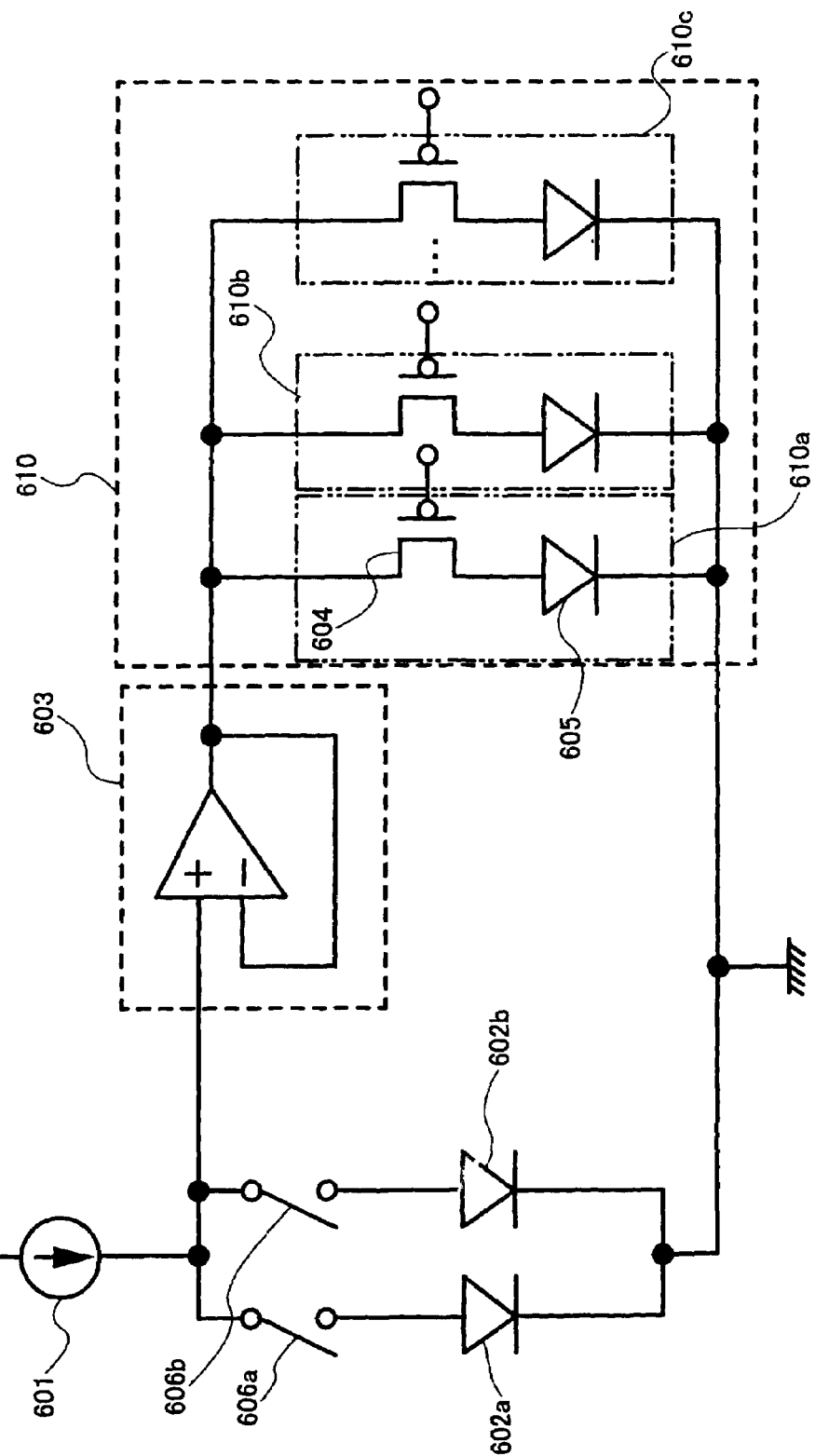
FIG. 6 is a diagram explaining a temperature compensation function according to the present invention.

A display device includes a current source 601, monitoring elements 602a and 602b, a voltage follower circuit 603, switches 606a and 606b, and a pixel 610. The pixel 610 includes a plurality of sub-pixels 610a, 610b, and 610c, and each sub-pixel includes a driving transistor 604 and a light-emitting element 605. In FIG. 6, the plurality of sub-pixels is formed of three sub-pixels 610a, 610b, and 610c, but the present invention is not limited thereto and two or more sub-pixels may be provided in one pixel. In addition, similarly to Embodiment Mode 1, in a case where the light-emitting element is formed of an EL element for example, EL elements of the monitoring elements 602a and 602b and an EL element provided in any of the plurality of sub-pixels 610a, 610b, and 610c are manufactured by using the same EL material under the same condition. In the display device according to the present invention, the monitoring element is manufactured into the same size as that of the sub-pixel included in the pixel and is not necessary to be provided into the same size as that of the pixel in the display portion. Therefore, the monitoring element can be downsized as compared with the size of the pixel in the display portion.

Operation of a compensation circuit with such a configuration will be briefly described. The switches 606a and 606b are alternately turned on. Thus, a current is always supplied to the monitoring element 602a or 602b. Then, a potential of an anode of either the monitoring element 602a or 602b is detected by the voltage follower circuit 603 and the potential can be set to be a potential of an anode of the light-emitting element 605. When periods during which the switches 606a and 606b are turned on are set to be the same, it is possible to delay deterioration with time of the monitoring elements 602a and 602b.

Further, a current is always supplied to either of the monitoring elements, and the potential of the anode of the monitoring element is detected to set the potential of the anode of the light emitting element; therefore, temperature compensation can also be always carried out.

Figure 7:
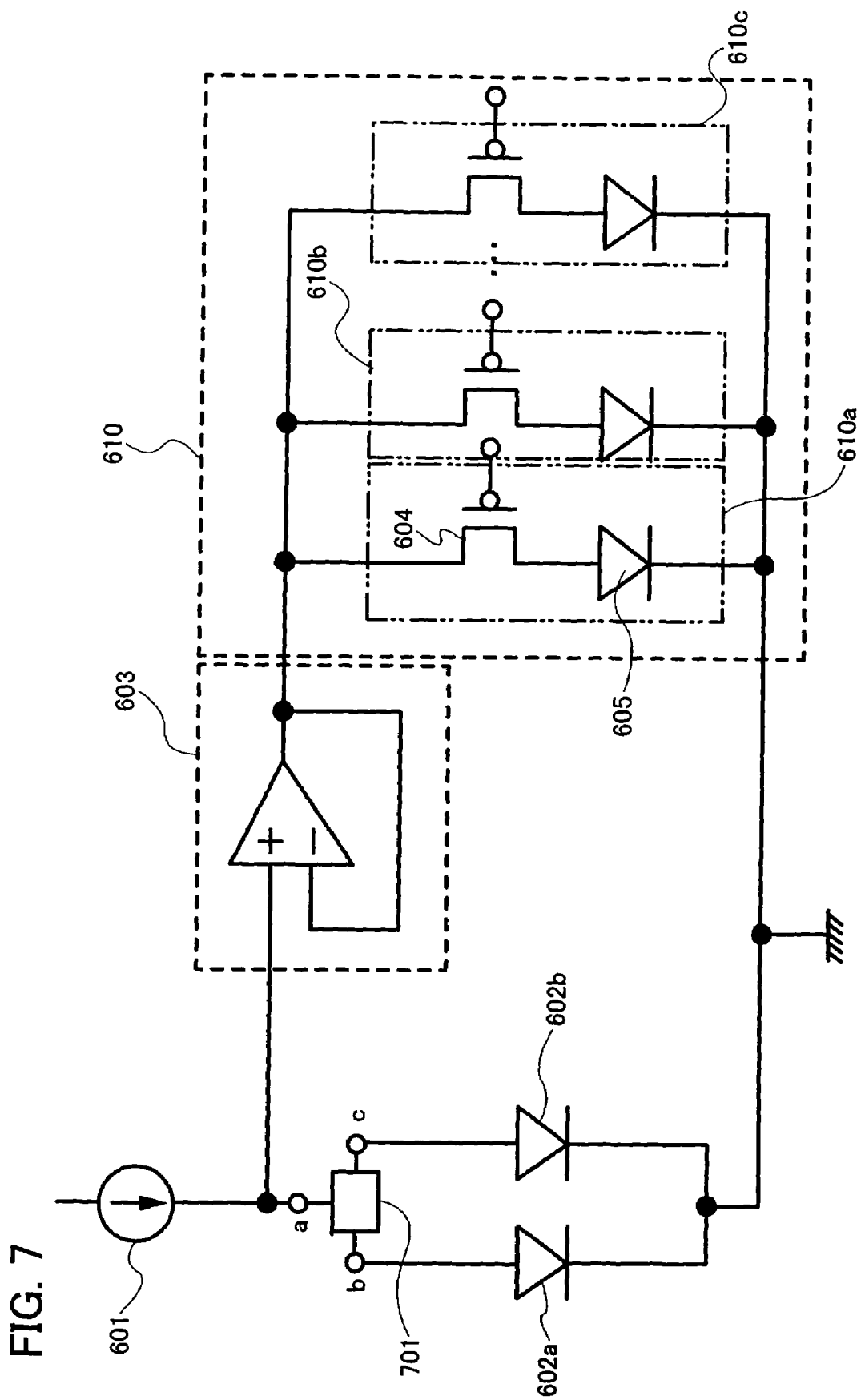
FIG. 7 is a diagram explaining a temperature compensation function according to the present invention.

FIG. 7 shows an example of a switch that can operate the compensation circuit in the aforementioned manner. A switch 701 serves as the switches 606a and 606b shown in FIG. 6. A terminal a of the switch 701 is connected to a current source 601, a terminal b is connected to an anode of a monitoring element 602a, and a terminal c is connected to an anode of a monitoring element 602b. When a current is supplied from the current source 601 to the monitoring element 602a, the terminals a and b of the switch 701 are conducted. Meanwhile, when a current is supplied to the monitoring element 602b, the terminals a and c are conducted.

Figure 8:
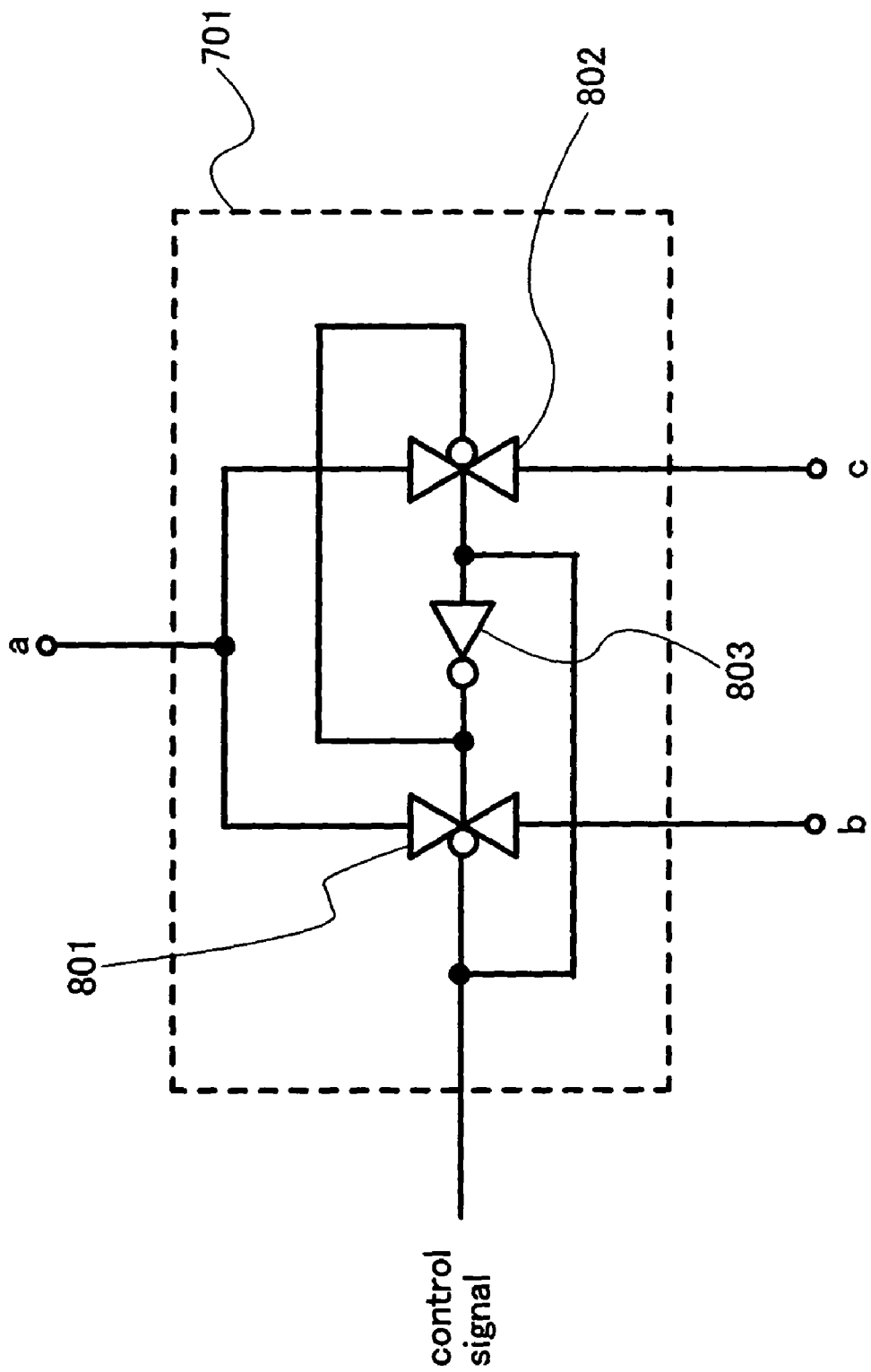
FIG. 8 is a diagram explaining a configuration of a switch which can be applied to the present invention.

FIG. 8 shows an example of a specific configuration of the switch 701. The switch 701 includes analog switches 801 and 802, and an inverter 803. A control signal is inputted to control input terminals of the analog switches 801 and 802, thereby turning on either the analog switch 801 or 802. Thus, either the monitoring element 602a or 602b can be selected to be supplied with a current.

Figure 9:
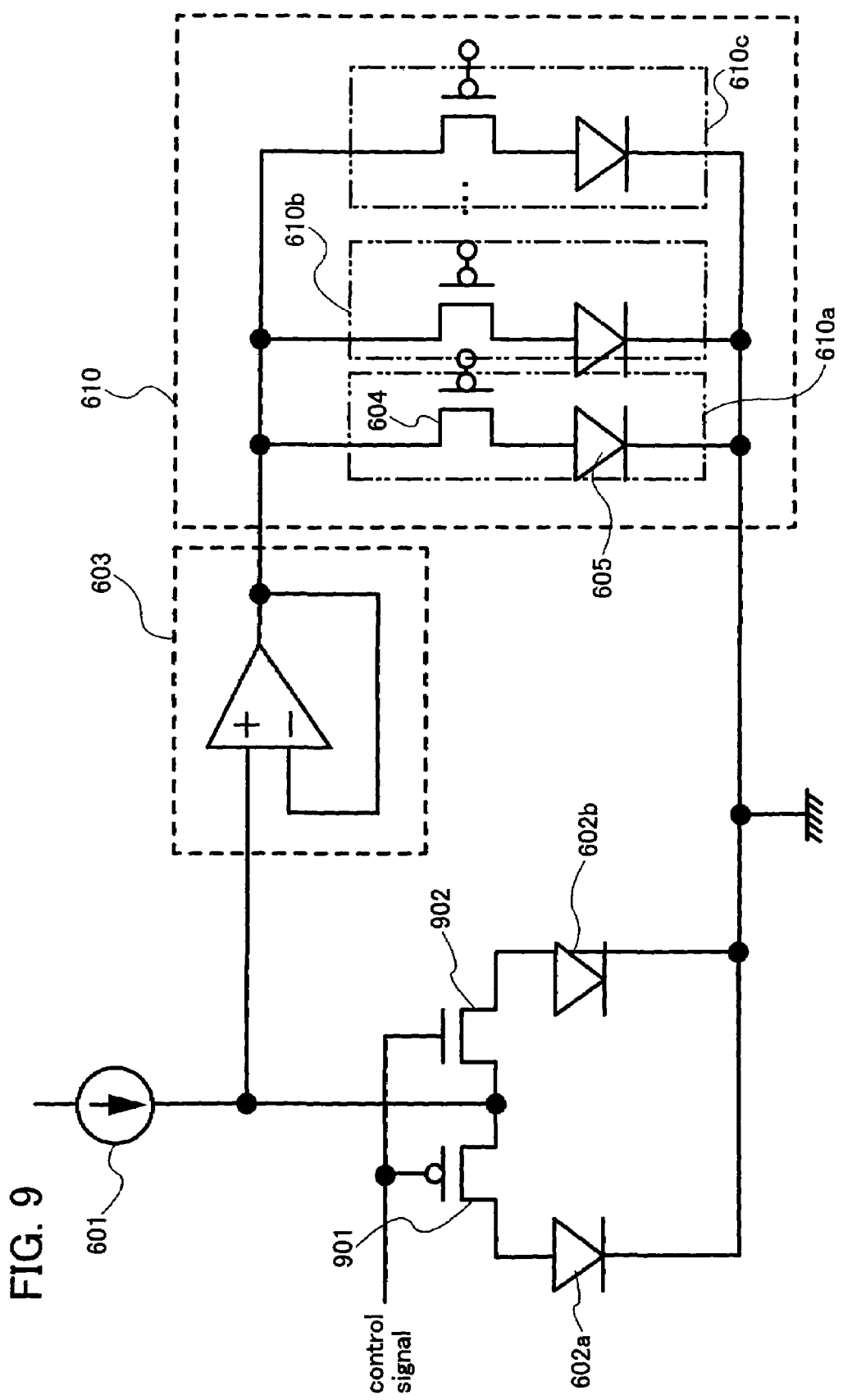
FIG. 9 is a diagram explaining a temperature compensation function according to the present invention.
Figure 13:
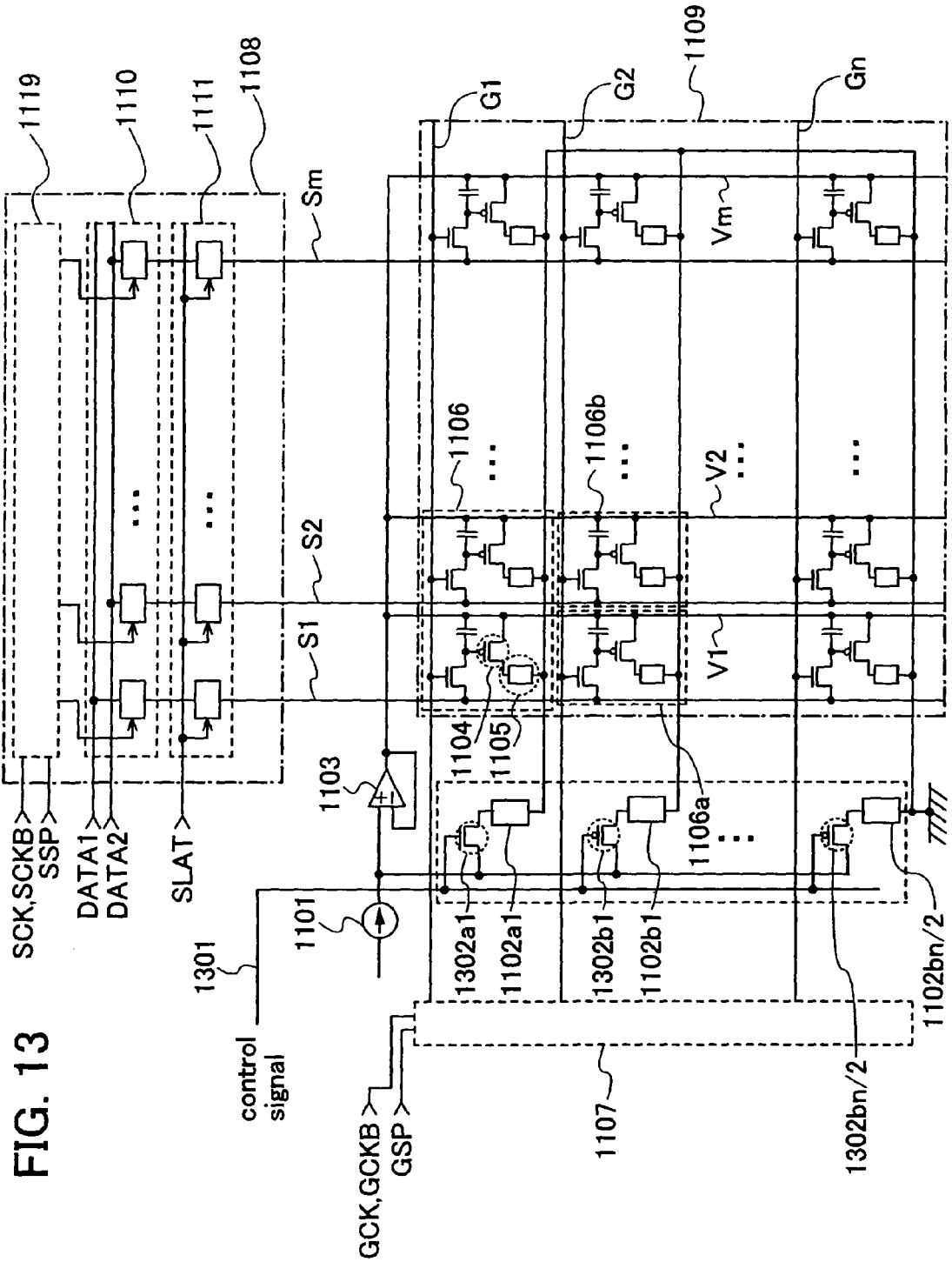
FIG. 13 is a diagram explaining a display device according to the present invention.

Alternatively, as shown in FIG. 9, a transistor may be used to realize a function as the switches 606a and 606b. A p-channel switching transistor 901 and an n-channel switching transistor 902 are used. A source terminal of the switching transistor 901 and a drain terminal of the switching transistor 902 are connected to a current source 601. A drain terminal of the switching transistor 901 is connected to an anode of a monitoring element 602a while a source terminal of the switching transistor 902 is connected to an anode of a monitoring element 602b. A control signal is inputted to gate terminals of these transistors. Then, either the switching transistor 901 or 902 is turned on because these transistors are different in polarity. Accordingly, either the monitoring element 602a or 602b can be selected. FIG. 13 shows a specific configuration example of a display device to which the above configuration is applied. The p-channel switching transistor 901 in FIG. 9 corresponds to a transistor 1302b in FIG. 13, and the n-channel switching transistor 902 in FIG. 9 corresponds to a transistor 1302a in FIG. 13. Then, a control signal is inputted from a control line 1301 to gate terminals of these transistors, and the p-channel transistor 1302b and the n-channel transistor 1302a are alternately turned on.

Figure 10:
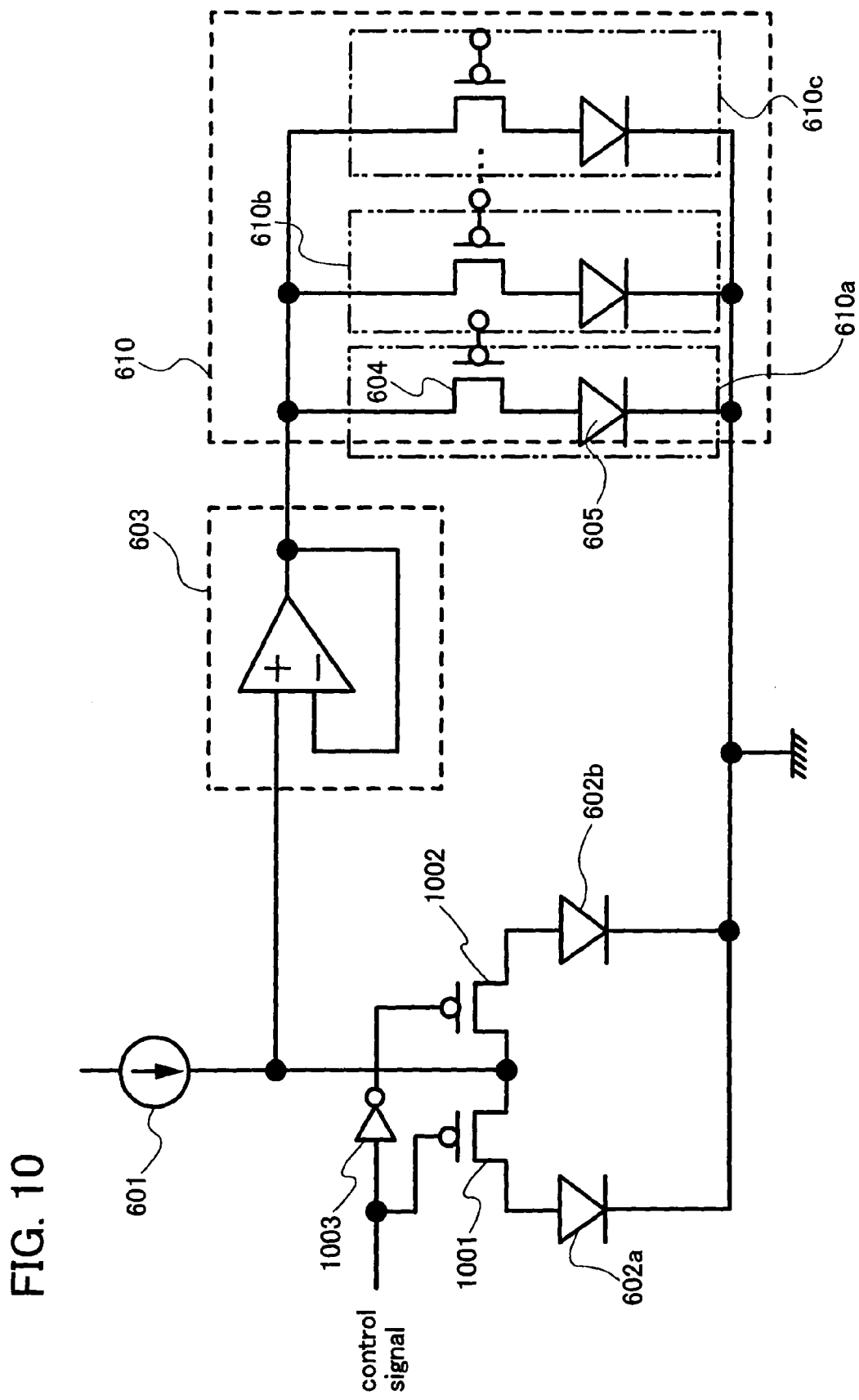
FIG. 10 is a diagram explaining a temperature compensation function according to the present invention.
Figure 14:
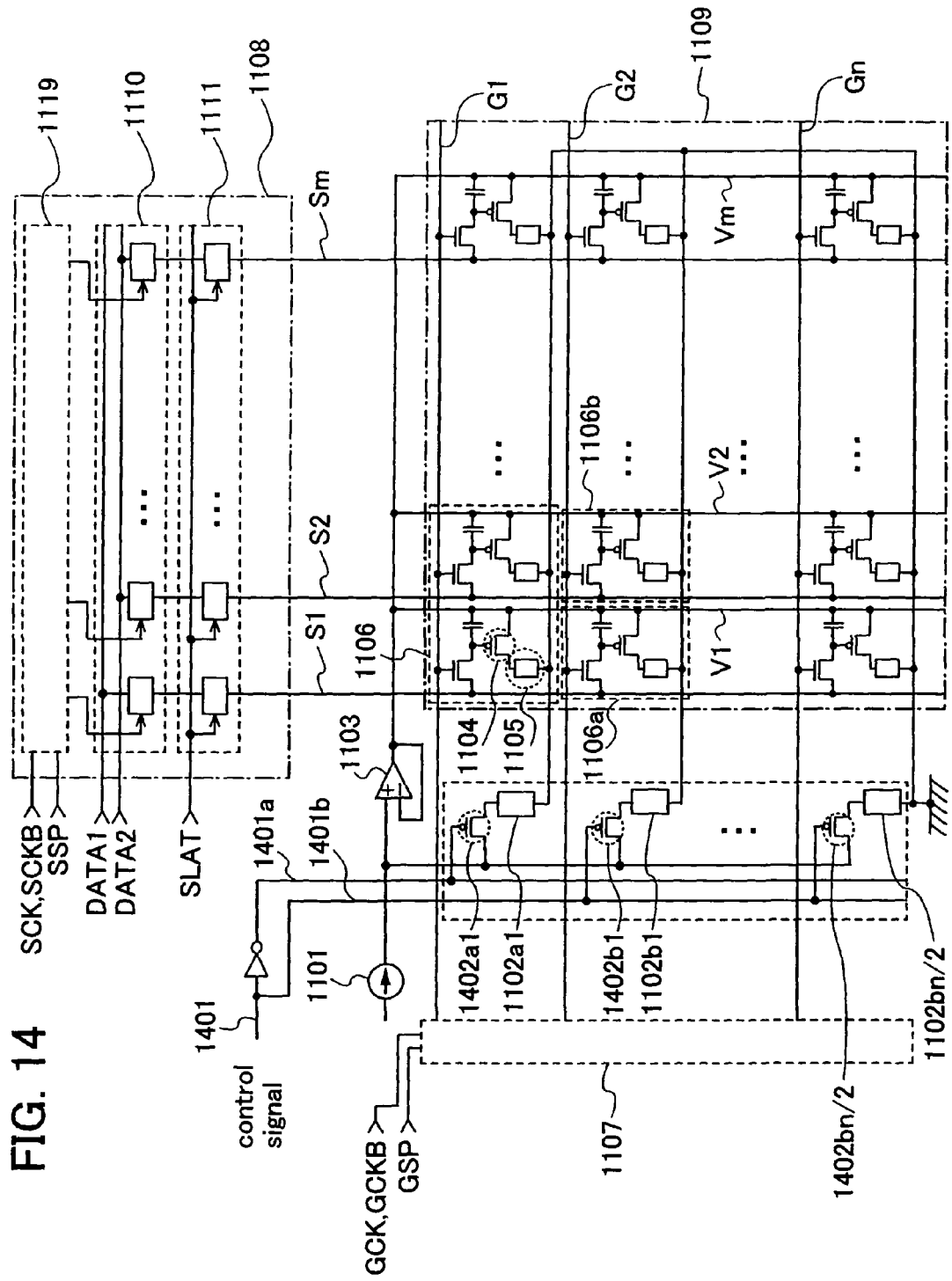
FIG. 14 is a diagram explaining a display device according to the present invention.

The same function can be achieved by using transistors with the same polarity as shown in FIG. 10. A control signal is inputted to a control input terminal of one switching transistor 1001 without change while a control signal is inputted to the other switching transistor 1002 through an inverter. Thus, an inverted control signal is inputted to the switching transistor 1002, and either of the switching transistors can be selected. It is to be noted that the p-channel switching transistors 1001 and 1002 are used in FIG. 10, but the same function can also be achieved by using only n-channel transistors. FIG. 14 shows a specific configuration example of a display device to which the above configuration is applied. The switching transistor 1001 in FIG. 10 corresponds to a transistor 1402b in FIG. 14, and the switching transistor 1002 in FIG. 10 corresponds to a transistor 1402a in FIG. 14. Then, a control signal is inputted from a control line 1401, and this control signal is inputted to a gate terminal of the transistor 1402b. An inverted control signal 1401a and a non-inverted control signal 1401b alternately turn on the transistors 1402b and 1402a.

The number of monitoring elements to be selected is not limited to two, and three or more monitoring elements may be arranged in parallel to further delay deterioration progression. Therefore, when three monitoring elements are arranged in parallel and sequentially selected to be supplied with a current, deterioration progression of the light emitting element and the monitoring element can be close to each other.

Figure 15:
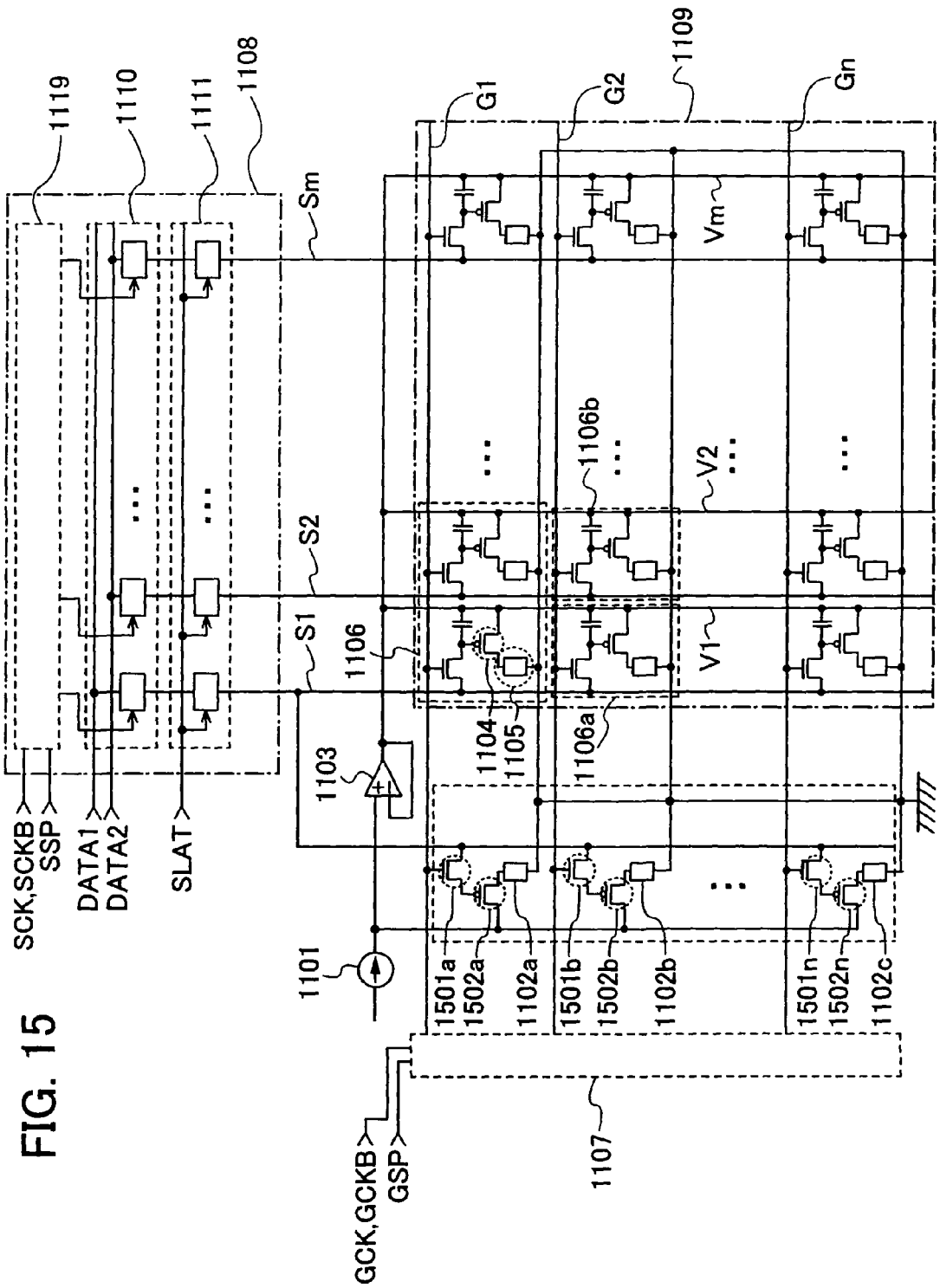
FIG. 15 is a diagram explaining a display device according to the present invention.

FIG. 15 shows a configuration for further enhancing deterioration compensation. In order to make deterioration progression of a light emitting element in a pixel 1106 and a monitoring element close to each other, a source signal line which supplies a signal to one column of a pixel portion 1109 is connected to source terminals of transistors 1501a to 1501n to control ON and OFF of the transistors 1501a to 1501n. Accordingly, the ratio of a light-emission period to a non light-emission period of a light-emitting element and a monitoring element in a certain column can be equivalent. It is to be noted that, in the configuration of FIG. 15, a signal line S1 is connected to the switching transistors 1501a to 1501n, which transmit a signal to a transistor controlling ON and OFF of the monitoring element.

In accordance with this embodiment mode, by making deterioration of a light-emitting element in a pixel and a monitoring element close to each other, variations in luminance due to variations in current value of the light-emitting element, which are caused by an environmental temperature change and a change with time, can be suppressed. Further, since it is not necessary to provide the monitoring element into the same size as that of the pixel in a display portion, the monitoring element can be downsized. In addition, by downsizing the monitoring element, downsizing of a display device, in other words, a narrow frame of the display device can be achieved.

It is to be noted that this embodiment mode can be implemented by being freely combined with any description of embodiments and embodiment modes in this specification.

Embodiment Mode 4

This embodiment mode will describe a configuration which is different from that of the display device described in the above embodiment modes. In this embodiment mode, a configuration of a display device, in which precision of deterioration compensation is enhanced while maintaining precision of temperature compensation, will be described with reference to FIG. 16.

Figure 16:
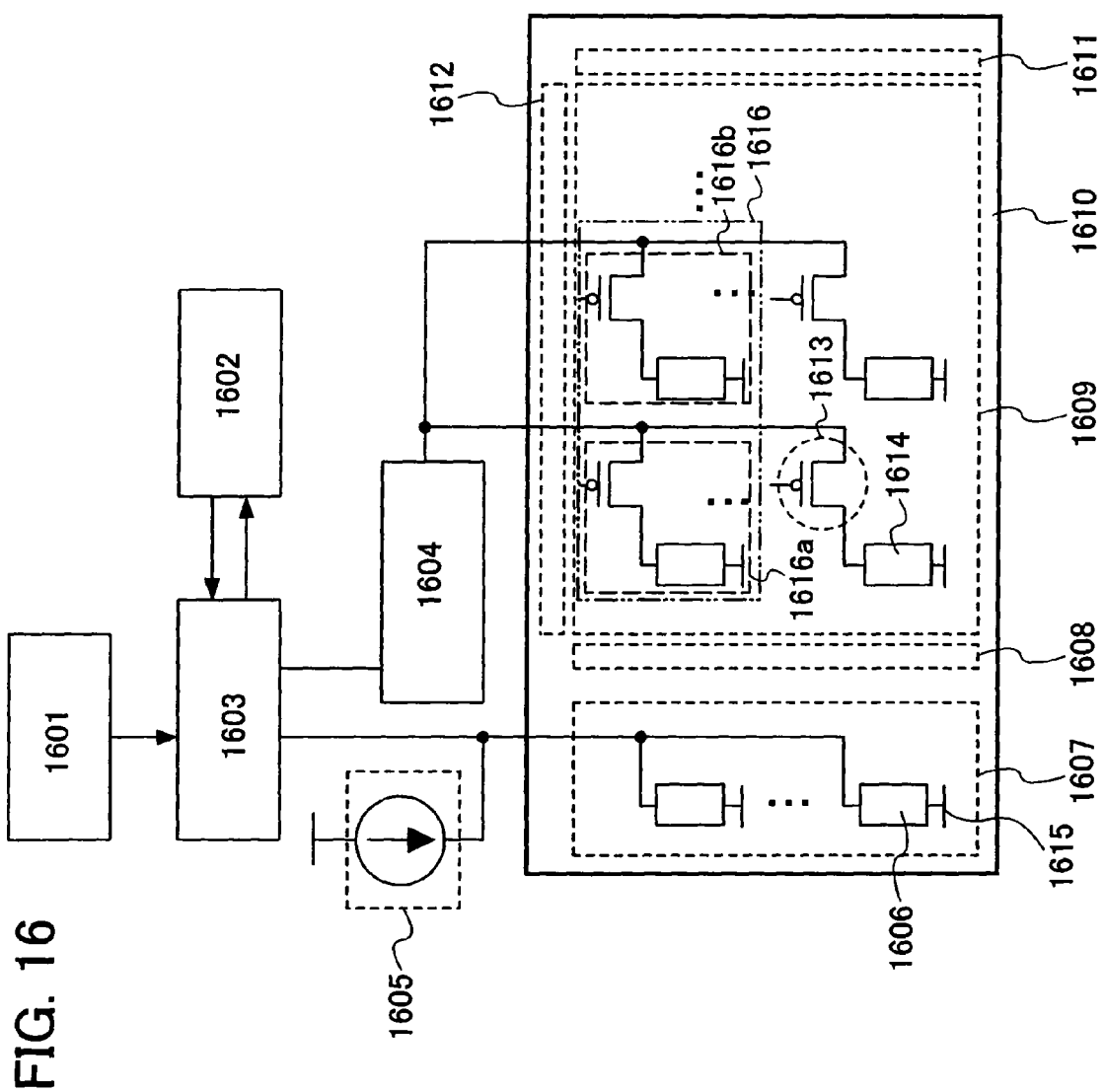
FIG. 16 is a diagram explaining a display device according to the present invention.

A display device of this embodiment mode shown in FIG. 16 includes a time-measuring circuit 1601, a memory circuit 1602, a correction data generating circuit 1603, a power supply circuit 1604, a current source 1605, and a pixel 1616 including a light-emitting element 1614 and a driving transistor 1613. These circuits may be provided over the same substrate 1610 with the light emitting element 1614 and a monitoring element 1606, or provided over another substrate.

A pixel region 1609 provided over the substrate 1610 includes a plurality of pixels 1616 arranged in matrix, each of which includes a first sub-pixel 1616a and a second sub-pixel 1616b. Each of the first sub-pixel and the second sub-pixel includes the light-emitting element 1614 and a transistor (only the driving transistor 1613 is illustrated in FIG. 16). The light-emitting element 1614 provided in the first sub-pixel or the second sub-pixel and the monitoring element 1606 are provided over the same substrate 1610. In other words, the both elements are formed in the same step under the same manufacturing condition and have the same characteristics with respect to an environmental temperature change and a change with time. In the display device according to the present invention, the monitoring element is manufactured into the same size as that of the sub-pixel included in the pixel and is not necessary to be provided into the same size as that of the pixel in the display portion. Therefore, the monitoring element can be downsized as compared with the size of the pixel in the display portion. Light emission/non light-emission and luminance of the light-emitting element 1614 are controlled by drivers provided over the substrate 1610 (a first gate driver 1608, a second gate driver 1611, and a source driver 1612 are illustrated here).

One or a plurality of the monitoring elements 1606 are provided over the substrate 1610. A monitoring circuit 1607 including one or a plurality of the monitoring elements 1606 may be provided either inside the pixel region 1609 or in other region. However, the monitoring circuit 1607 is desirably provided in a region other than the pixel region 1609 so that image display is not adversely affected.

The monitoring element 1606 is supplied with a constant current from the current source 1605. With an environmental temperature change or a change with time under such a condition, a resistance value of the monitoring element 1606 itself changes. Thus, a potential difference between both electrodes of the monitoring element 1606 changes because a current value of the monitoring element 1606 is always constant.

In the aforementioned configuration, a potential of an opposing electrode 1615 among the two electrodes of the monitoring element 1606 does not change while a potential of the other electrode of the monitoring element 1606, which is connected to the current source 1605 (called a first electrode here) changes. The changed potential of the first electrode of the monitoring element 1606 is outputted to the correction data generating circuit 1603.

The time-measuring circuit 1601 has a function of measuring time during which power is supplied from the power supply circuit 1604 to a panel including the light-emitting element 1614, or a function of measuring a light-emission period of the light-emitting element 1614 by sampling a video signal supplied to each pixel in the pixel region 1609. In a case of the latter function, the pixel region 1609 includes a plurality of the light-emitting elements 1614, each of which has a different light-emission period; thus, the light-emission period of each light-emitting element 1614 may be calculated, and an average value thereof may be adopted. Alternatively, the light-emission period of several light-emitting elements 1614 selected from the plurality of light-emitting elements 1614 may be calculated, and an average value thereof may be adopted. The time-measuring circuit 1601 outputs a signal including information on elapsed time obtained through one of the aforementioned functions to the correction data generating circuit 1603.

The memory circuit 1602 is a circuit for storing a change with time of voltage-current characteristics of the light-emitting element 1614. That is, the memory circuit 1602 stores the voltage-current characteristics of the light-emitting element 1614 for each elapsed time, preferably for 10,000 to 100,000 hours. The memory circuit 1602 outputs, based on a signal supplied from the correction data generating circuit 1603, data on the voltage-current characteristics of the light-emitting element 1614 corresponding to the elapsed time, to the correction data generating circuit 1603.

The correction data generating circuit 1603 calculates an optimal voltage condition for operating the light-emitting element 1614 based on output of the monitoring element 1606 and output of the memory circuit 1602. That is, an optimal voltage condition for obtaining desired luminance is calculated. Then, a signal including the information is outputted to the power supply circuit 1604.

The power supply circuit 1604 supplies, based on a signal supplied from the correction data generating circuit 1603, a corrected power supply potential to the light-emitting element 1614.

It is to be noted that, in a case of displaying a color image using a panel including the light-emitting element 1614, electroluminescent layers each having a different emission wavelength band may be respectively provided in the pixels. Typically, electroluminescent layers corresponding to colors of red (R), green (G) and blue (B) may be provided. In this case, the monitoring elements 1606 may be provided correspondingly to colors of red, green and blue respectively in order to individually correct a power supply potential for each color.

An acceleration test of EL deterioration is carried out to calculate an acceleration factor. Then, data obtained by estimating deterioration characteristics for a long period may be stored in the memory circuit 1602.

In accordance with the present invention having the aforementioned configuration, an influence of variations in current value of a light-emitting element, which is caused by an environmental temperature change and a change with time, can be suppressed by setting the optimal voltage condition of the light-emitting element by using the monitoring element. In addition, since the present invention does not require user's operation, longer life of a product can be ensured by continuously performing correction even after the product is distributed to an end user. Further, since it is not necessary to provide the monitoring element into the same size as that of a pixel in a display portion, the monitoring element can be downsized. In addition, by downsizing the monitoring element, downsizing of a display device, in other words, a narrow frame of the display device can be achieved.

It is to be noted that this embodiment mode can be implemented by being freely combined with any description of embodiments and embodiment modes in this specification.

Embodiment Mode 5

This embodiment mode will describe a configuration which is different from that of the display device described in the above embodiment modes. In this embodiment mode, a method for correcting deterioration with time of a light-emitting element in a pixel in a non-display period by using the display devices shown in Embodiment Modes 1 to 4 will be described.

A degree of deterioration progression with time of a light-emitting element is high at the initial stage, and it becomes gradually lower with time. Thus, an initial aging process, which causes initial deterioration with time of all the light-emitting elements, may be carried out to a display device using light-emitting elements before adjusting luminance of the light-emitting elements (before shipment, for example). By carrying out such an initial aging process to cause drastic initial deterioration with time of the light-emitting elements in advance, deterioration with time of the light-emitting elements can be prevented from progressing rapidly afterwards. Therefore, a phenomenon such as a screen burn caused by the deterioration with time of the light-emitting elements can be reduced.

It is to be noted that the initial aging process is carried out by controlling light emitting elements to emit light only for a certain period. This is preferably carried out by applying a voltage higher than usual. Accordingly, initial deterioration with time can be generated in a short period.

When the display device according to the present invention is operated by using a charging type battery, it is desirable to carry out, when the display device is not being used but being charged, a lighting/flashing process of all the pixels, an image display process by which contrast of a normal image (a standby image, for example) is inverted, a lighting/flashing process of the pixels that are lighted with less frequency, which are detected by sampling a video signal, and the like. The aforementioned processes that are carried out when the display device is not being used in order to reduce screen burns are called flash-out processes. When such a flash-out process is carried out, a difference between the brightest portion of a burned image and the darkest portion can be set to have 5 or less gradations, and more preferably 1 or less gradation even if the screen burn is caused after the process. Further, in order to reduce the screen burns, a process by which an image is prevented from being fixed for a long period as much as possible may be carried out in addition to the aforementioned processes.

This embodiment mode can be implemented by being freely combined with any description of embodiments and embodiment modes in this specification. In other words, in accordance with this embodiment mode, a screen burn can be reduced, and variations in luminance due to variations in current value of a light-emitting element, which are caused by an environmental temperature change and a change with time, can be suppressed. Further, since it is not necessary to provide a monitoring element into the same size as that of a pixel in a display portion, the monitoring element can be downsized. In addition, by downsizing the monitoring element, downsizing of a display device, in other words, a narrow frame of the display device can be achieved.

Embodiment Mode 6

This embodiment mode will describe a configuration which is different from that of the display device described in the above embodiment modes. In this embodiment mode, a circuit configuration which turns off a monitoring controlling transistor when a monitoring element is short-circuited and operation thereof will be described.

In this embodiment mode, a monitoring controlling transistor and an inverter that are connected to a monitoring element are provided. The monitoring controlling transistor and the inverter are provided in view of operational defects of the monitoring element, which are caused by defects (including initial defects and defects caused with time) of the monitoring element. For example, considered is a case where, if a current source is connected to a monitoring element without using other transistors and the like, an anode and a cathode of the monitoring element are short-circuited due to defects in a manufacturing process or the like. Then, a large amount of current is supplied from the current source to the short-circuited monitoring element. As a result, appropriate changes in potential of the monitoring element cannot be supplied to the light-emitting element.

Figure 17A:
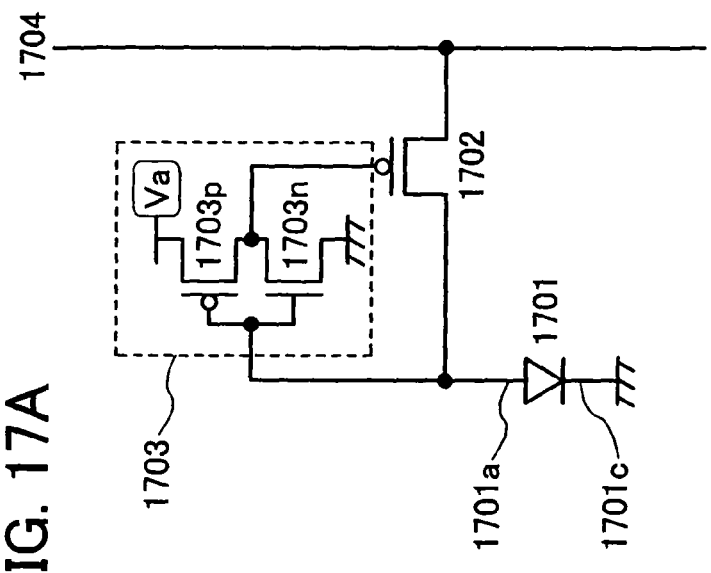
FIGS. 17A and 17B are diagrams each showing a monitoring circuit according to the present invention.

Operation of a circuit in the periphery of the monitoring element will be specifically described with reference to FIGS. 17A and 17B. As shown in FIG. 17A, if an electrode on a high potential side is to be a first electrode 1701a and an electrode on a low potential side is to be a second electrode 1701c in the electrodes of a monitoring element 1701, the first electrode 1701a is connected to an input terminal of an inverter 1703 while the second electrode 1701c is connected to an earth potential (GND: ground potential) to have a fixed potential. Accordingly, when an anode and a cathode of the monitoring element 1701 are short-circuited, the potential of the first electrode 1701a becomes close to the potential of the second electrode 1701c. As a result, a low potential that is close to the potential of the second electrode 1701c is supplied to the inverter 1703; therefore, a p-channel transistor 1703p of the inverter 1703 is turned on. Then, a potential on a high potential side (Va) is outputted from the inverter 1703 to be a gate potential of a monitoring controlling transistor 1702. That is to say, the potential Va is inputted to a gate of the monitoring controlling transistor 1702, and the monitoring controlling transistor 1702 is turned off.

Here, attention is paid to the order of supplying a constant current to the monitoring element 1701. A constant current is required to start flowing to a monitoring line 1704 (a wiring connected to the current source 101 and the buffer amplifier 103 in Embodiment Mode 1) in a state where the monitoring controlling transistor 1702 is turned on. In this embodiment mode, as shown in FIG. 17B, a current starts flowing to the monitoring line 1704 while keeping Va at Low. After the potential of the monitoring line 1704 is in a saturation state, Va is made to be VDD. As a result, the monitoring line 1704 can be charged even when the monitoring controlling transistor 1702 is turned on.

On the other hand, when the monitoring element 1701 is not short-circuited, the potential of the first electrode 1701a is supplied to the inverter 1703, and thus, an n-channel transistor 1703n is turned on. Then, a potential on a low potential side is outputted from the inverter 1703, thereby turning on the monitoring controlling transistor 1702.

In this manner, current supply from the current source to the short-circuited monitoring element 1701 can be prevented. Thus, in a case where a plurality of monitoring light-emitting elements are provided, when at least one monitoring element of the monitoring elements is short-circuited, current supply to the short-circuited monitoring element can be interrupted to minimize a change in potential of the monitoring line 1704. As a result, an appropriate change in potential of the monitoring element 1701 can be supplied to a pixel portion.

Another configuration of a circuit which turns off a monitoring controlling transistor when a monitoring element is short-circuited and operation thereof will be described.

Figure 18A:
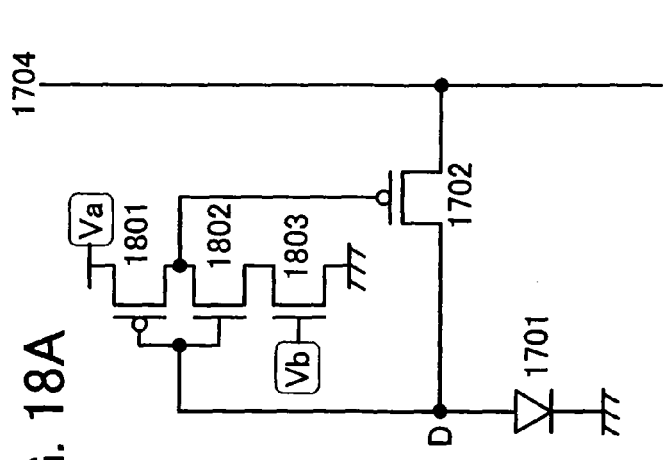
FIGS. 18A and 18B are diagrams each showing a monitoring circuit according to the present invention.

A circuit in the periphery of the monitoring element shown in FIG. 18A includes a first p-channel transistor 1801, a second n-channel transistor 1802 that has a gate electrode in common with the first transistor and is connected in parallel to the first transistor, and a third n-channel transistor 1803 that is connected in series to the second transistor. A monitoring element 1701 is connected to gate electrodes of the first and second transistors 1801 and 1802. A gate electrode of a monitoring controlling transistor 1702 is connected to an electrode at which the first and second transistors 1801 and 1802 are connected to each other. Other configurations are similar to those in FIG. 17A.

A potential on a high potential side of the first p-channel transistor 1801 is to be Va and a potential of a gate electrode of the third n-channel transistor 1803 is to be Vb. Then, a potential of the monitoring line 1704, the potential Va, and the potential Vb are driven in the manner shown in FIG. 18B.

First, the potential of the monitoring line 1704 is made to be in a saturation state, and then, the potential Va is set to be High. When the monitoring element 1701 is short-circuited, a potential of an anode that is a first electrode of the monitoring element 1701, i.e. a potential at a point D falls to a potential substantially equal to that of a cathode of the monitoring element 1701. Thus, a Low potential is inputted to the gate electrodes of the first and second transistors 1801 and 1802, and the second n-channel transistor 1802 is turned off while the first p-channel transistor 1801 is turned on. Then, a potential on a high potential side that is the potential of one electrode of the first transistor 1801 is inputted to the gate electrode of the monitoring controlling transistor 1702, and the monitoring controlling transistor 1702 is turned off. As a result, no current is supplied from the monitoring line 1704 to the short-circuited monitoring element 1701.

Figure 18B:
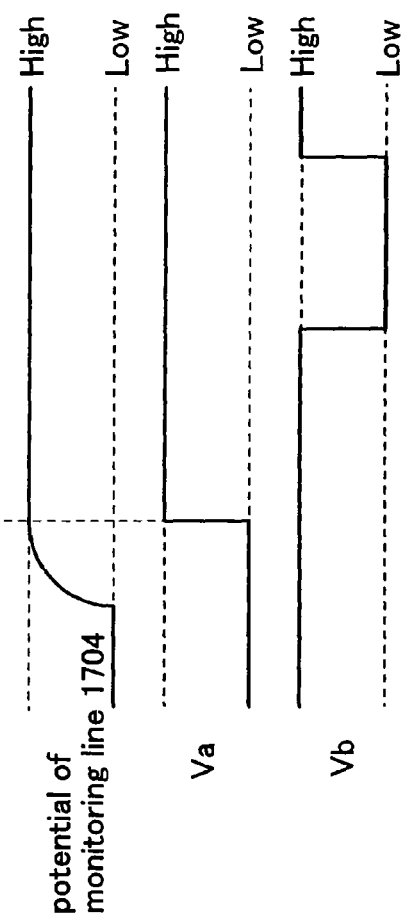

At this time, when the potential of the anode is slightly reduced because of a small short-circuit, it may be difficult to control which of the first and second transistors 1801 and 1802 to be turned on or off. Thus, as shown in FIGS. 18A and 18B, the potential Vb is supplied to the gate electrode of the third transistor 1803. That is to say, as shown in FIG. 18B, the potential Vb is set to be Low while the potential Va is High. Then, the third n-channel transistor 1803 is turned off. As a result, if the potential of the anode is the potential that is lower than VDD by a threshold voltage of the first transistor, the first transistor 1801 can be turned on, and the monitoring controlling transistor 1702 can be turned off.

By controlling the potential Vb in such a manner, the monitoring controlling transistor 1702 can be precisely turned off even when the potential of the anode is slightly reduced.

When the monitoring element operates normally, the monitoring controlling transistor 1702 is controlled to be turned on. In other words, since the potential of the anode is substantially equal to a high potential of the monitoring line 1704, the second transistor 1802 is turned on. As a result, a low potential is applied to the gate electrode of the monitoring controlling transistor 1702 so that the monitoring controlling transistor 1702 is turned on.

Figure 19A:
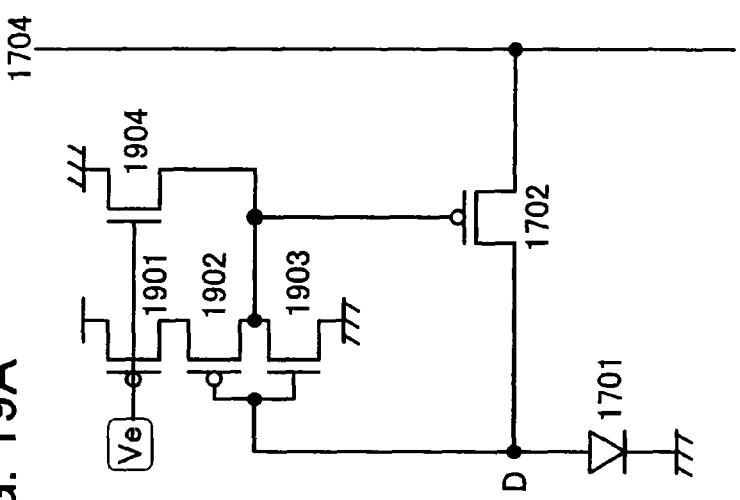
FIGS. 19A and 19B are diagrams each showing a monitoring circuit according to the present invention.
Figure 19B:
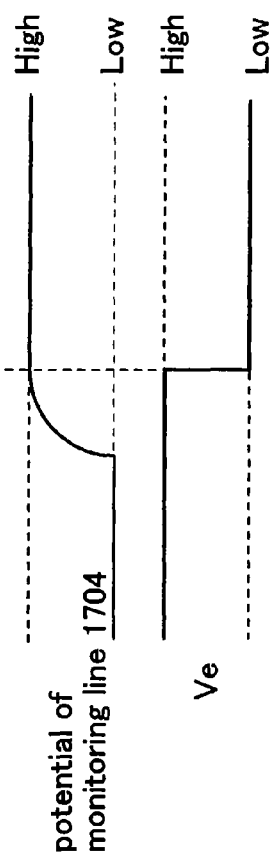

As shown in FIG. 19A, a first p-channel transistor 1901, a second p-channel transistor 1902 that is connected in series to the first transistor, a third n-channel transistor 1903 that has a gate electrode in common with the second transistor, and a fourth n-channel transistor 1904 that has a gate electrode in common with the first transistor and is connected in parallel to the first transistor are provided. A monitoring element 1701 is connected to gate electrodes of the second and third transistors 1902 and 1903. A gate electrode of the monitoring controlling transistor 1702 is connected to an electrode at which the second and third transistors 1902 and 1903 are connected to each other. Further, the gate electrode of the monitoring controlling transistor 1702 is connected to one electrode of the fourth transistor 1904. Other configurations are similar to those in FIG. 17A.

First, a potential of the monitoring line 1704 is made to be in a saturation state, and then, a potential Ve is set to be Low. When the monitoring element 1701 is short-circuited, a potential of an anode of the monitoring element 1701, i.e. a potential at a point D falls to a potential substantially equal to that of a cathode of the monitoring element 1701. Thus, a Low potential is inputted to the gate electrodes of the second and third transistors 1902 and 1903, and the third n-channel transistor 1903 is turned off while the second p-channel transistor 1902 is turned on. In addition, when the potential Ve is set to be Low, the first transistor 1901 is turned on while the fourth transistor 1904 is turned off. Then, a potential on a high potential side of the first transistor is inputted to the gate electrode of the monitoring controlling transistor 1702 through the second transistor 1902, and the monitoring controlling transistor 1702 is turned off. As a result, no current is supplied from the monitoring line 1704 to the short-circuited monitoring element 1701.

By controlling the voltage Ve of the gate electrode in such a manner, the monitoring controlling transistor 1702 can be precisely turned off.

In accordance with this embodiment mode, deterioration progression of a light-emitting element in a pixel can be corrected even when a monitoring element is short-circuited, and variations in luminance due to variations in current value of the light-emitting element, which are caused by an environmental temperature change and a change with time, can be suppressed. Further, since it is not necessary to provide the monitoring element into the same size as that of the pixel in a display portion, the monitoring element can be downsized. In addition, by downsizing the monitoring element, downsizing of a display device, in other words, a narrow frame of the display device can be achieved.

It is to be noted that this embodiment mode can be implemented by being freely combined with any description of embodiments and embodiment modes in this specification.

Embodiment 1

This embodiment will describe an equivalent circuit of a pixel having a sub-pixel and operation thereof.

Figure 20:
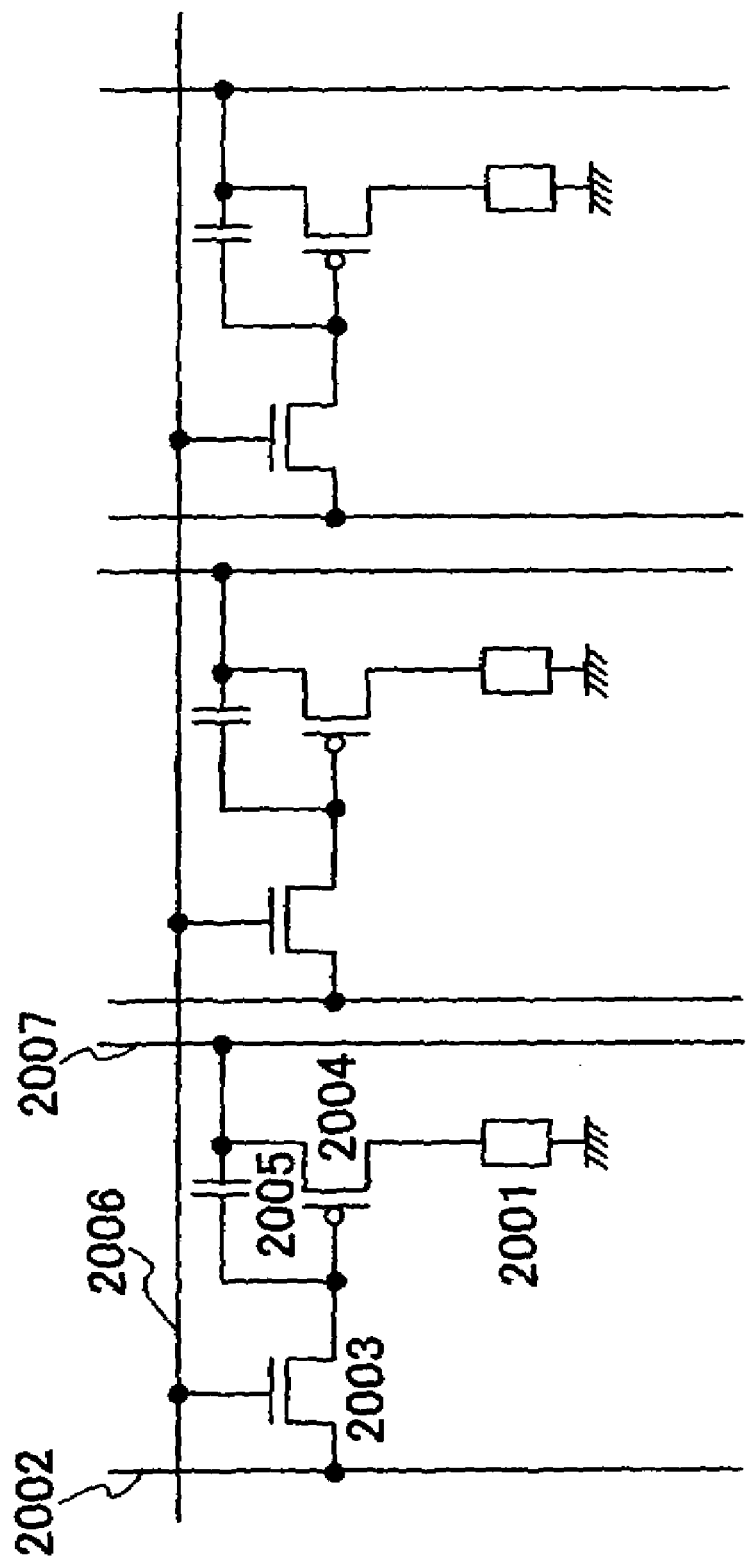
FIG. 20 is a circuit diagram of a pixel in a display device according to the present invention.

FIG. 20 shows an equivalent circuit of a sub-pixel including a light-emitting element 2001, a signal line 2002 to which a video signal is inputted, a switching transistor 2003 controlling input of a video signal to a pixel, a driving transistor 2004 controlling light-emission and non light-emission of the light-emitting element 2001, and a capacitor element 2005 for holding a potential of a video signal. As for characteristics of each transistor, an enhancement type or depletion type transistor can be used.

In this embodiment, the switching transistor 2003 is to be an n-channel transistor and the driving transistor 2004 is to be a p-channel transistor When gate capacitance of the driving transistor 2004 is high and a leak current from each transistor is in an allowable range, the capacitor element 2005 is not required to be provided.

The components in such a pixel configuration are connected to each other as below. A gate electrode of the switching transistor 2003 is connected to a scanning line 2006, a first electrode thereof is connected to the signal line 2002, and a second electrode thereof is connected to a gate electrode of the driving transistor 2004. A first electrode of the driving transistor 2004 is connected to a power supply line 2007, and the capacitor element 2005 is provided between a gate and a source of the driving transistor 2004. The capacitor element 2005 is connected so that a potential difference between the gate and the source of the driving transistor 2004 is held, that is, a potential of a video signal is held when the switching transistor 2003 is not selected (in a off-state). Therefore, one electrode of the capacitor element is connected to the gate electrode of the driving transistor 2004, and the other is connected to the power supply line 2007.

By providing a plurality of sub-pixels as described above and controlling a light-emission area of each light-emitting element, area gradation display is carried out.

Figure 21A:
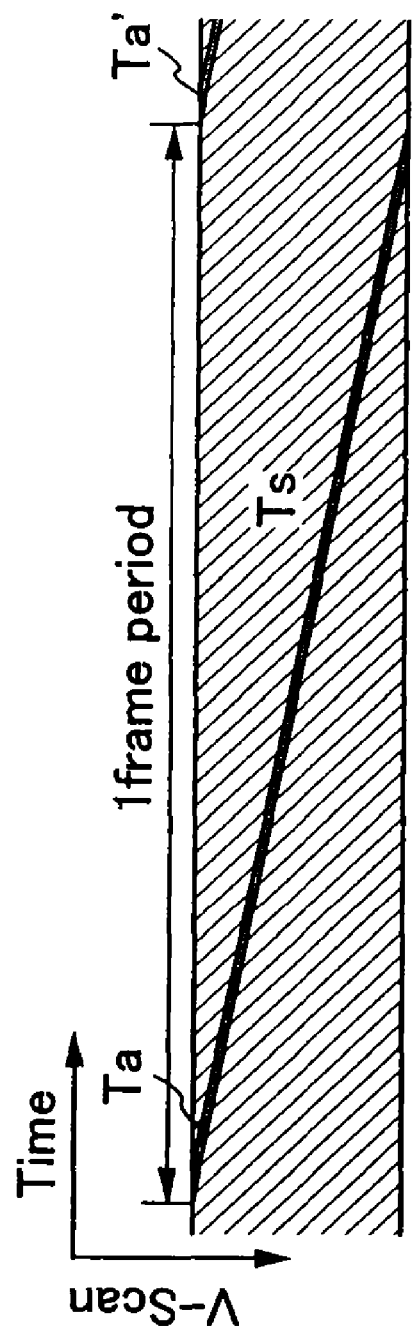
FIGS. 21A and 21B are diagrams each showing a timing chart in a pixel of a display device according to the present invention.
Figure 21B:
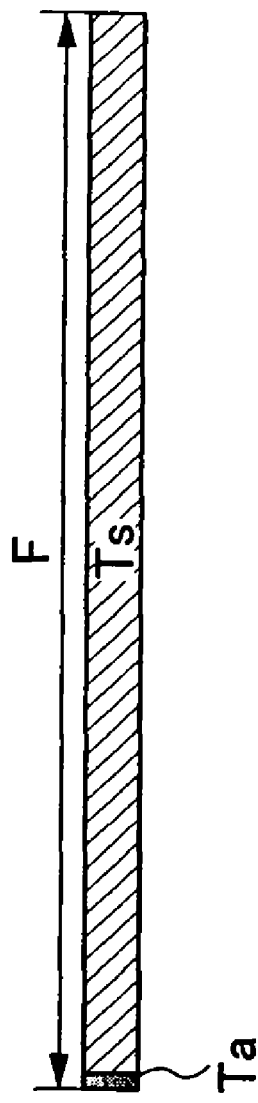

Subsequently, specific operation of each transistor in the sub-pixel will be described using timing charts as shown in FIGS. 21A and 21B. It is to be noted that FIG. 21A shows a timing chart in a case where a vertical axis indicates a scanning line and a horizontal axis indicates time, and FIG. 21B shows a timing chart of a scanning line Gj in the j-th row.

A display device generally has a frame frequency of about 60 Hz. In other words, writing of screen is performed about 60 times per second, and a period during which writing of screen is performed once is called one frame period (a unit frame period). In a sub-pixel, one frame period is divided into a writing period Ta and a light-emission period Ts as shown in FIG. 21A.

In the writing period Ta, when the scanning line 2006 is sequentially selected, the switching transistor 2003 connected to the scanning line 2006 is turned on. Further, when the switching transistor 2003 is turned on, electric charges are accumulated in the capacitor element 2005 by a video signal inputted from the signal line. When the electric charges are equal to or higher than a threshold voltage Vth of the driving transistor 2004, the driving transistor 2004 is turned on and the light-emitting element 2001 emits light.

The light-emitting element 2001 emits light at luminance corresponding to a supplied current, and the light-emission period Ts starts.

In addition, in the light-emission period Ts, the switching transistor 2003 is turned off by controlling a potential of the scanning line 2006, and a potential of a video signal that is written in the writing period Ta is held in the capacitor element 2005. Consequently, the light-emitting element 2001 continues to emit light.

That is, in a case where the driving transistor 2004 is turned off by a video signal inputted from the signal line in the writing period Ta, a potential is not held in the capacitor element 2005 in the light-emission period Ts; thus, the light-emitting element emits no light.

In a case where the driving transistor 2004 is turned on in the writing period Ta, a potential of a video signal is held in the capacitor element 2005 in the light-emission period Ts, and the light-emitting element continues to emit light. On the other hand, in a case where the driving transistor 2004 is turned off in the writing period Ta, a potential of a video signal is not held in the capacitor element 2005 in the light-emission period Ts, and the light-emitting element emits no light.

As set forth above, gradation display is performed by switching light-emission and non-light emission of the light-emitting element. In particular, area gradation display is performed by switching light-emission and non-light emission of the light-emitting elements while making differences between light-emission areas of the light-emitting elements in individual sub-pixels.

In accordance with this embodiment, variations in luminance due to variations in current value of a light-emitting element, which are caused by an environmental temperature change and a change with time, can be suppressed. Further, since it is not necessary to provide a monitoring element into the same size as that of a pixel in a display portion, the monitoring element can be downsized. In addition, by downsizing the monitoring element, downsizing of a display device, in other words, a narrow frame of the display device can be achieved.

It is to be noted that this embodiment can be implemented by being freely combined with any description of embodiments and embodiment modes in this specification.

Embodiment 2

This embodiment will describe an equivalent circuit of a pixel including a sub-pixel, which is different from that in Embodiment 1, and operation thereof.

An equivalent circuit shown in FIG. 22 is different from that in Embodiment 1 shown in FIG. 20 in that a transistor 2208 for erasing a potential of a video signal that is written (hereinafter referred to as an erasing transistor) is provided. That is, FIG. 22 shows an equivalent circuit of a sub-pixel including a light-emitting element 2201, a signal line 2202 to which a video signal is inputted, a switching transistor 2203 controlling input of a video signal to a pixel, a driving transistor 2204 controlling light-emission and non light-emission of the light-emitting element 2201, the erasing transistor 2208 for erasing a potential of a video signal that is written, and a capacitor element 2205 for holding a potential of a video signal. As for characteristics of each transistor, an enhancement type or depletion type transistor may be used.

In this embodiment, the switching transistor 2203 and the erasing transistor 2208 are to be n-channel transistors and the driving transistor 2204 is to be a p-channel transistor.

When gate capacitance of the driving transistor 2204 is high and a leak current from each transistor is in an allowable range, the capacitor element 2205 is not required to be provided.

The components in such a pixel configuration are connected to each other as below. A gate electrode of the switching transistor 2203 is connected to a first scanning line 2206a, a first electrode thereof is connected to the signal line 2202, and a second electrode thereof is connected to a gate electrode of the driving transistor 2204. A first electrode of the driving transistor 2204 is connected to a power supply line 2207, and the capacitor element 2205 is provided between a gate and a source of the driving transistor 2004. The capacitor element 2205 is provided so that a potential difference between the gate and the source of the driving transistor 2004 is held, that is, a potential of a video signal is held when the switching transistor 2203 is not selected (in a off-state). Therefore, one electrode of the capacitor element is connected to the gate electrode of the driving transistor 2204, and the other is connected to the power supply line 2207.

A gate electrode of the erasing transistor 2208 is connected to a second scanning line 2206b, and a first electrode and a second electrode thereof are connected to both electrodes of the capacitor element 2205, respectively. That is, the erasing transistor 2208 is provided in a position for erasing a potential of a video signal held in the capacitor element 2205.

In a sub-pixel including the erasing transistor 2208, gradation display combining an area gradation method and a time gradation method can be carried out. In the time gradation method, as disclosed in Japanese Published Patent Application No. 2001-5426, gradation display is carried out by controlling light-emission periods of a light-emitting element. It is to be noted that an erasing transistor is not necessarily provided in the time gradation method.

Specific operation of the sub-pixel shown in FIG. 22 is divided into a writing period Ta, a light-emission period Ts, and an erasing period Te. Operation in each period will be described below.

Figures 23A, 23B:
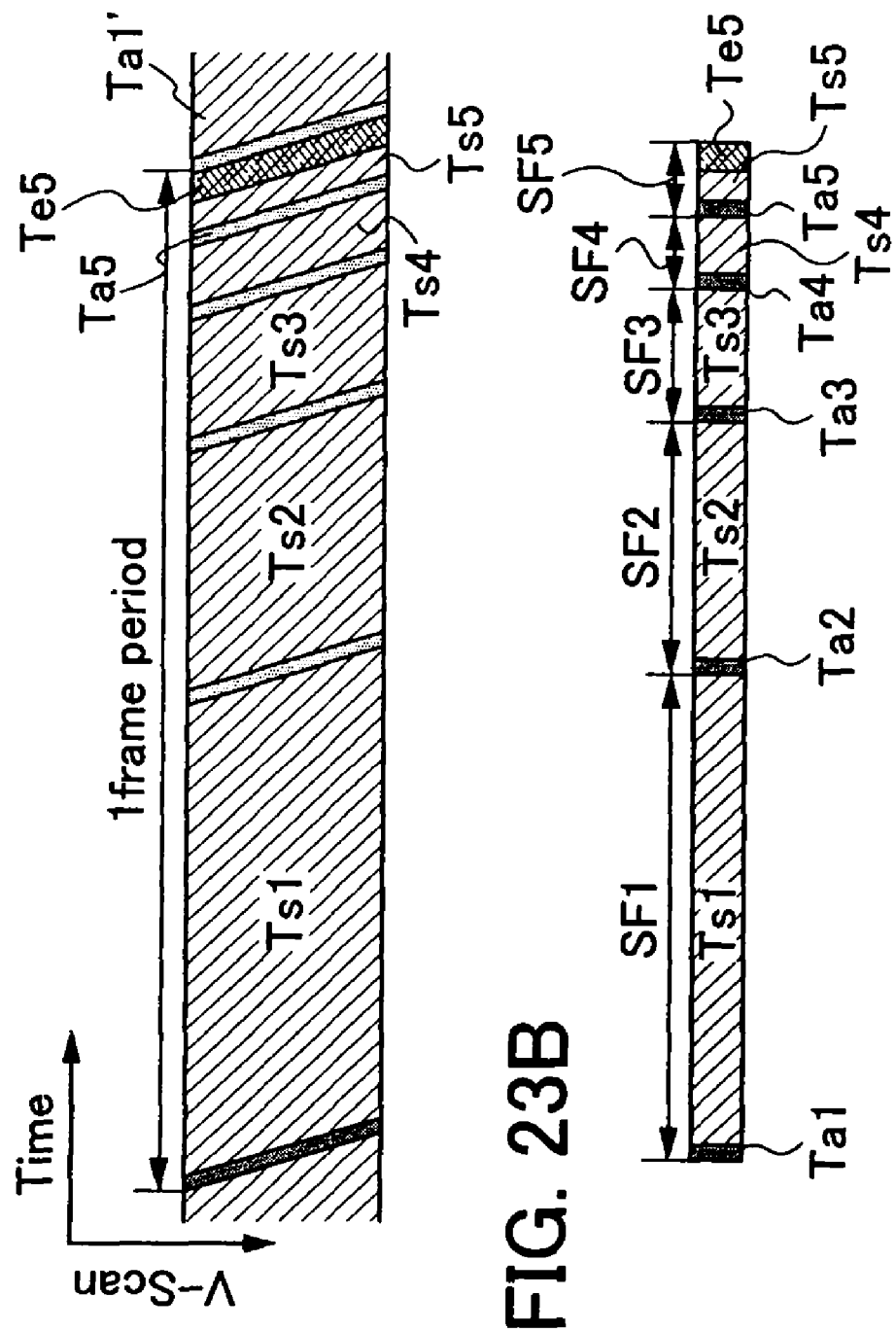
FIGS. 23A and 23B are diagrams each showing a timing chart in a pixel of a display device according to the present invention.

FIGS. 23A and 23B are timing charts in which one frame period is divided into five sub-frame periods SF1 to SF5 and an image is displayed with 5-bit gradation. The number of sub-frames is equal to the number of bits in many cases; however, they may differ from each other in some cases. FIG. 23A shows a timing chart in a case where a vertical axis indicates a scanning line and a horizontal axis indicates time. FIG. 23B shows a timing chart of a scanning line Gj in the j-th row.

Operation in the writing period Ta and the light-emission period Ts is the same as that in Embodiment 1 shown in FIGS. 21A and 21B, and the description will be omitted.

In the erasing period Te, the second scanning line 2206b is selected and the erasing transistor 2208 is turned on; then, a potential of the power supply line 2207 is supplied to the gate of the driving transistor 2204 through the erasing transistor 2208. Then, when the erasing transistor 2208 is turned on, electric charges held in the capacitor element 2205 are discharged to turn off the driving transistor 2204, and thus, a state can be made, where the light-emitting element 2201 emits no light.

The erasing period Te allows the next writing period to start before video signals are written to all the pixels, leading to high-level gradation display. It is to be noted that the erasing period Te may be provided as needed when adopting the time gradation method.

When the number of gradation levels is required to be increased, the number of sub-frame periods may be increased. The sub-frame periods are not necessarily arranged from the most significant bit to the least significant bit in order, and they may be arranged at random in one frame period. Moreover, the order of sub-frame periods may change in each frame period, or a sub-frame period may be further divided.

The area gradation display, which has a limitation to the number of gradation levels in accordance with the number of sub-pixels, may be combined with the time gradation display to achieve high-level gradation display. Moreover, by providing an erasing transistor as needed, much higher-level gradation display can be performed.

In accordance with this embodiment, also when area gradation display and time gradation display are combined, variations in luminance due to variations in current value of a light-emitting element, which are caused by an environmental temperature change and a change with time, can be suppressed. Further, since it is not necessary to provide a monitoring element into the same size as that of a pixel in a display portion, the monitoring element can be downsized. In addition, by downsizing the monitoring element, downsizing of a display device, in other words, a narrow frame of the display device can be achieved.

It is to be noted that this embodiment can be implemented by being freely combined with any description of embodiments and embodiment modes in this specification.

Embodiment 3

Figure 17B:
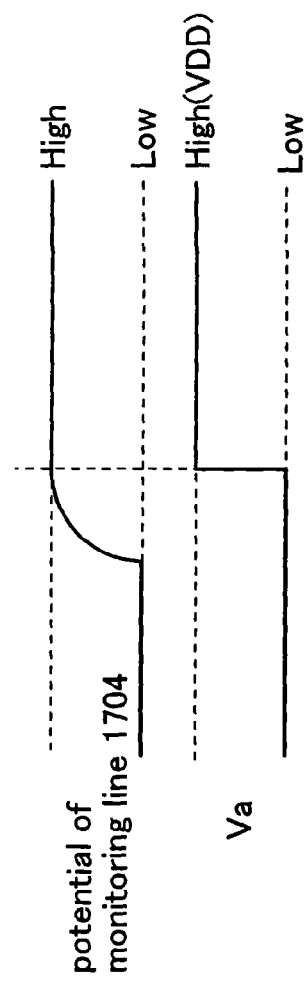

This embodiment will describe top views of the pixel circuit and the circuit in the periphery of the monitoring element shown in FIGS. 17A and 17B, and 20.

Figure 24A:
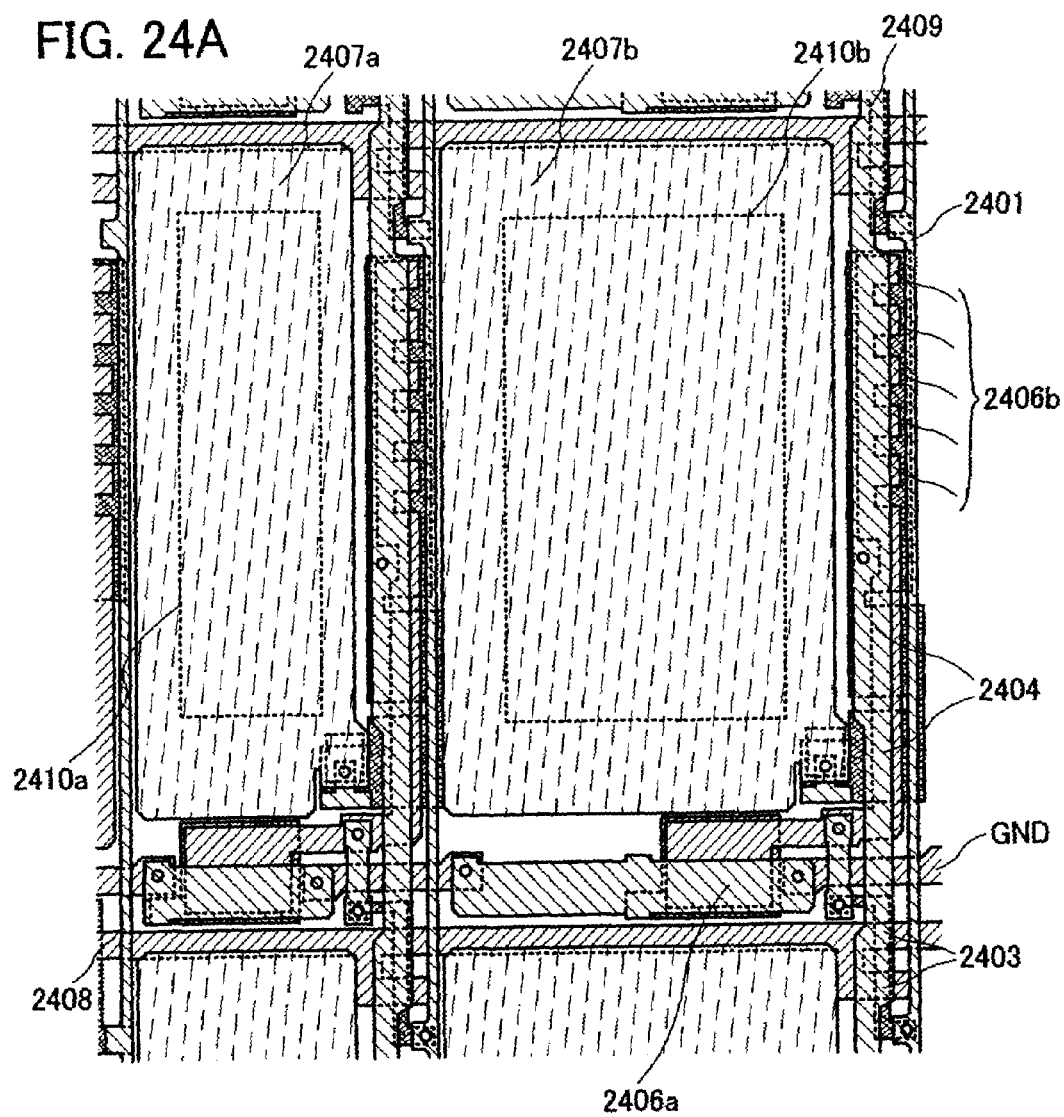
FIGS. 24A and 24B are top views each showing a pixel in a display device according to the present invention.
Figure 24B:
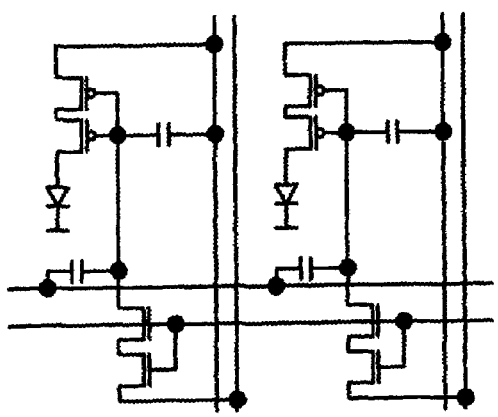

FIG. 24A showing a top view corresponding to FIG. 20 shows a signal line 2401, a power supply line 2409, a scanning line 2408, a switching transistor 2403, a driving transistor 2404, a first electrode 2407a of a light-emitting element in a first sub-pixel, a light-emitting element 2410a of the first sub-pixel, a first electrode 2407b of a light-emitting element in a second sub-pixel, a light-emitting element 2410b of the second sub-pixel, capacitor elements 2406a and 2406b, and a ground line GND. In addition, FIG. 24B shows a circuit diagram corresponding to the top view shown in FIG. 24A. It is to be noted that, in this embodiment, a plurality of the capacitor elements 2406a and 2406b are provided; however, either or neither of them may be provided.

In FIGS. 24A and 24B, when each transistor has a top gate structure, films are stacked in the order of a substrate, a semiconductor layer, a gate insulating film, a scanning line, an interlayer insulating film, and a signal line. In a case of a bottom gate structure, films are stacked in the order of a substrate, a scanning line, a gate insulating film, a semiconductor layer, an interlayer insulating film, and a signal line.

In FIGS. 24A and 24B, the power supply line 2409 is formed in parallel to the signal line 2401. Therefore, the signal line 2401 and the power supply line 2409 are obtained by pattering the same conductive film.

The switching transistor 2403 has a double gate structure in which two gate electrodes are provided with respect to a semiconductor film, and part of the scanning line 2408 serves as the gate electrodes. In addition, a first electrode of the switching transistor 2403 is connected to the signal line 2401 through a contact hole, and a second electrode thereof is connected to the capacitor elements 2406a and 2406b. Further, one electrode of the capacitor element 2406b is formed of a conductive film that is used for forming the gate electrode of the driving transistor 2404, and a semiconductor film corresponding to the other electrode is connected to the power supply line 2409 through a contact hole.

The gate electrode of the driving transistor 2404 is connected to the power supply line 2409 having a fixed potential through a contact hole, a second electrode thereof is connected to a wiring formed of a conductive film that is used for forming the signal line, and the first electrode 2407b of the light-emitting element is formed over and to be connected to the wiring. The wiring and the anode may also be connected to each other through a contact hole.

It is to be noted that a double gate structure in which two channel forming regions of the switching transistor 2403 and the driving transistor 2404 are formed is described; however, a single gate structure in which one channel forming region is formed or a triple gate structure in which three channel forming regions are formed may also be employed. Alternatively, a dual gate structure in which two gate electrodes are provided above and below a channel forming region with a gate insulating film interposed therebetween or other structure may also be employed.

The anode of the light-emitting element is formed of a transparent conductive film typified by ITO (indium tin oxide), and the area ratio of 2407a:2407b is set to be 1:2. Then, an electroluminescent layer and a cathode are formed over the anode. The electroluminescent layer emits light or no light in accordance with a video signal inputted from the signal line 2401. Thus, by making such differences between light-emission areas as to be 1:2 and selecting these light-emission areas, the area gradation display can be performed.

Figure 25A:
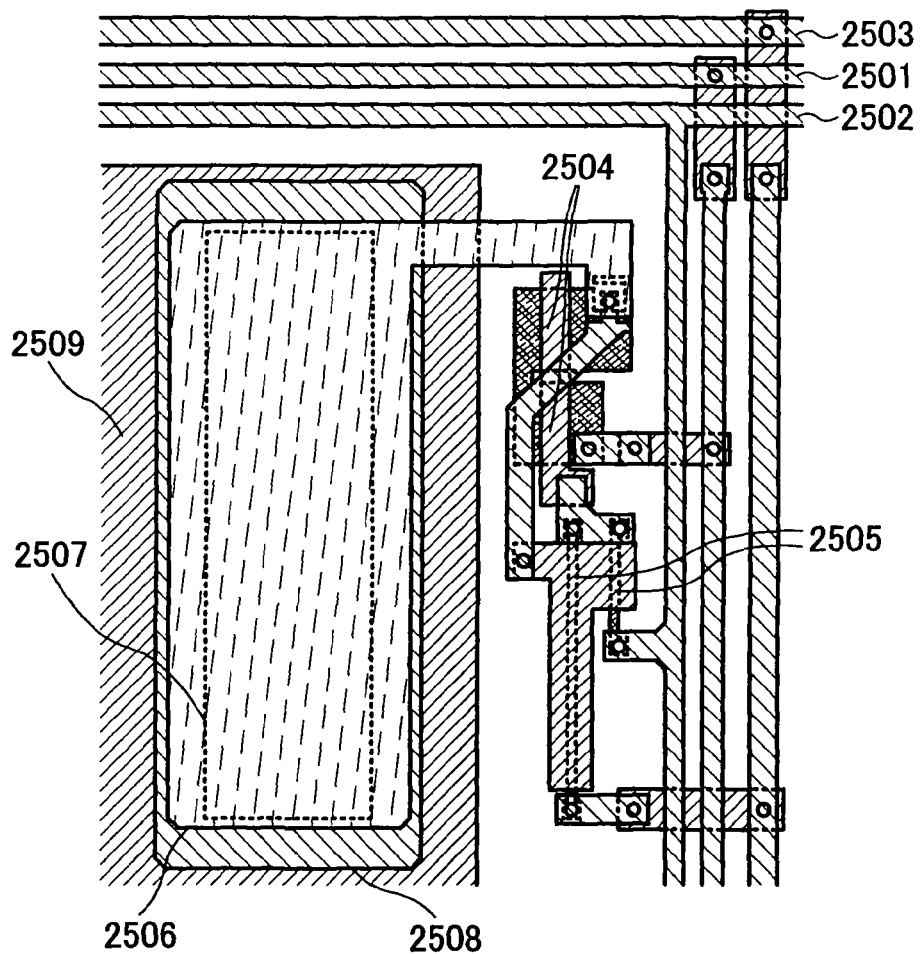
FIGS. 25A and 25B are top views each showing a circuit in the periphery of a monitoring element in a display device according to the present invention.
Figure 25B:
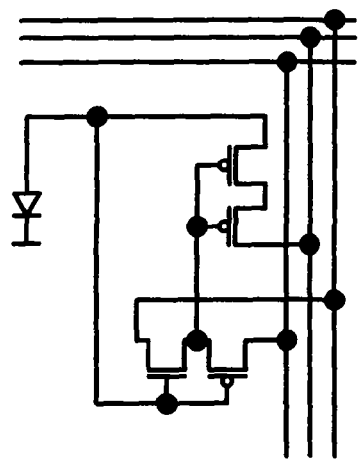

FIGS. 25A and 25B showing top views corresponding to FIGS. 17A and 17B show a monitoring line 2501, a first wiring 2502 for inputting a potential on a high potential side of an inverter, a wiring 2503 for inputting a potential on a low potential side of the inverter, a monitoring controlling transistor 2504, an inverter 2505, a first electrode 2506 of a monitoring element, a monitoring element 2507, a second electrode 2508 of the monitoring element, and a light-shielding film 2509.

In FIGS. 25A and 25B, when each transistor has a top gate structure, films are stacked in the order of a substrate, a semiconductor layer, a gate insulating film, a first wiring, an interlayer insulating film, and a second wiring. In a case of a bottom gate structure, films are stacked in the order of a substrate, a first wiring, a gate insulating film, a semiconductor layer, an interlayer insulating film, and a second wiring.

The monitoring controlling transistor 2504 has a double gate structure in which two gate electrodes are provided with respect to a semiconductor film. In addition, a first electrode of the monitoring controlling transistor 2504 is connected to the monitoring line 2501 through a contact hole, and a second electrode thereof is connected to a first electrode of the monitoring element and an input terminal of the inverter. Further, an output terminal of the inverter 2505 is connected to a gate of the monitoring controlling transistor.

It is to be noted that a double gate structure in which two channel forming regions of the monitoring controlling transistor 2504 are formed is described; however, a single gate structure in which one channel forming region is formed or a triple gate structure in which three channel forming regions are formed may also be employed. Alternatively, a dual gate structure in which two gate electrodes are provided above and below a channel forming region with a gate insulating film interposed therebetween or other structure may also be employed.

The anode of the monitoring element is formed of a transparent conductive film typified by ITO (indium tin oxide), and an electroluminescent layer and a cathode are formed over the anode. Further, an area of the monitoring element is set to be almost the same as that of the light-emitting element 2410a shown in FIGS. 24A and 24B. The electroluminescent layer of the monitoring element emits light or no light in accordance with a signal inputted from the monitoring line 2501. In the display device according to the present invention, the area of the monitoring element is not required to be the same as the area of the pixel. Thus, the monitoring element can be downsized. In addition, downsizing of the display device, in other words, a narrow frame of the display device can be achieved.

It is to be noted that a configuration of a wiring in the periphery of the pixel and the monitoring element of the display device according to the present invention can be provided in various ways and is not particularly limited to the configurations as described in this specification.

In accordance with this embodiment, variations in luminance due to variations in current value of a light-emitting element, which are caused by an environmental temperature change and a change with time, can be suppressed. Further, since it is not necessary to provide a monitoring element into the same size as that of a pixel in a display portion, the monitoring element can be downsized. In addition, by downsizing the monitoring element, downsizing of a display device, in other words, a narrow frame of the display device can be achieved.

It is to be noted that this embodiment can be implemented by being freely combined with any description of embodiments and embodiment modes in this specification.

Embodiment 4

This embodiment will describe an enlarged view of a cross-section of a sub-pixel. It is to be noted that, in this embodiment, a thin film transistor (TFT) including polycrystalline silicon is used as a transistor. Obviously, in the display device according to the present invention, the transistor is not limited to the one formed of polycrystalline silicon, and a compound having semiconductor characteristics such as amorphous silicon may be used.

As shown in FIG. 28A, a p-channel driving transistor 2801 is formed over a substrate 2800 having an insulating surface and includes a crystalline semiconductor film which is crystallized by laser irradiation or heat treatment, or crystallized by using catalysis of a metal element such as nickel or titanium. A gate electrode and a gate line are formed over the semiconductor film with a gate insulating layer interposed therebetween, and the semiconductor film below the gate electrode serves as a channel forming region. Then, an impurity element such as boron is added to the semiconductor film in a self-aligned manner by using the gate electrode as a mask, and thus, impurity regions serving as a source region and a drain region are obtained. A first insulating film is formed so as to cover the gate electrode, and contact holes are formed in the first insulating film over the impurity regions. Wirings are formed in the contact holes and the wirings serve as a source wiring and a drain wiring. A first electrode 2811 of a light-emitting element is formed so as to be electrically connected to a drain electrode. Subsequently, a second insulating film is formed so as to cover the first electrode 2811 and an opening is formed in the second insulating film over the first electrode. An electroluminescent layer 2812 is formed in the opening and a second electrode 2813 of the light-emitting element is formed so as to cover the electroluminescent layer and the second insulating film.

The electroluminescent layer 2812 includes an HIL (a hole injection layer), an HTL (a hole transport layer), an EML (a light-emitting layer), an ETL (an electron transport layer), and an EIL (an electron injection layer), which are stacked in this order over the first electrode 2811. Typically, CuPc is used for the HIL, α-NPD is used for the HTL, BCP is used for the ETL, and BCP:Li is used for the EIL.

When displaying a full color image, materials which emit red (R) light, green (G) light, and blue (B) light may be each selectively formed as the electroluminescent layer 2812 by an evaporation method using an evaporation mask, an ink jet method, or the like. Specifically, CuPc or PEDOT is used for the HIL, α-NPD is used for the HTL BCP or Alq$_3$ is used for the ETL, and BCP:Li or CaF$_2$ is used for the EIL, respectively. For the EML, Alq$_3$ doped with a dopant corresponding to each of R, G, and B light (DCM and the like for R light, or DMQD and the like for G light) may be used. It is to be noted that the electroluminescent layer is not limited to the aforementioned stacked structure.

A stacked structure of the electroluminescent layer is more specifically exemplified herein. When the electroluminescent layer 2812 which emits red light is formed, for example, after forming 30 nm thick CuPc and 60 nm thick α-NPD, Alq$_3$ doped with DCM$_2$ and rubrene is formed to have a thickness of 40 nm as a light-emitting layer for red light; BCP is formed to have a thickness of 40 nm as an electron transport layer; and BCP doped with Li is formed to have a thickness of 1 nm as an electron injection layer by using the same evaporation mask. When the electroluminescent layer 2812 which emits green light is formed, for example, after forming 30 nm thick CuPc and 60 nm thick α-NPD, Alq$_3$ doped with coumarin 545T is formed to have a thickness of 40 nm as a light-emitting layer for green light; BCP is formed to have a thickness of 40 nm as an electron transport layer; and BCP doped with Li is formed to have a thickness of 1 nm as an electron injection layer by using the same evaporation mask. When the electroluminescent layer 2812 which emits blue light is formed, for example, after forming 30 nm thick CuPc and 60 nm thick α-NPD, bis[2-(2-hydroxyphenyl)benzoxazolato] zinc:Zn (PBO)$_2$ is formed to have a thickness of 10 nm as a light-emitting layer for blue light; BCP is formed to have a thickness of 40 nm as an electron transport layer; and BCP doped with Li is formed to have a thickness of 1 nm as an electron injection layer by using the same evaporation mask.

CuPc and α-NPD which are used in common to the electroluminescent layer of each color can be formed over the entire surface of the pixel portion. Further, a mask can be shared for each color. For example, an electroluminescent layer for red light, an electroluminescent layer for green light, and an electroluminescent layer for blue light can be formed by suitably sliding the single mask. The order of the formation of the electroluminescent layer of each color can be determined appropriately.

In a case of forming an electroluminescent layer which emits white light, full color display can be performed by separately providing a color filter or a color filter and a color conversion layer, and the like. The color filter and the color conversion layer may be formed over a second substrate before attaching the second substrate to the substrate.

A material is selected in view of a work function of the first electrode. Described below is a case where the first electrode serves as an anode and the second electrode serves as a cathode, for example.

For the first electrode, preferably, metal, alloy, an electrically conductive compound, and a mixture of these materials having a high work function (4.0 eV) are used. Specifically, ITO (indium tin oxide), IZO (indium zinc oxide) in which 2 to 20% of zinc oxide (ZnO) is mixed in indium oxide, gold (Au), platinum (Pt), nickel (Ni), tungsten (W), chromium (Cr), molybdenum (Mo), iron (Fe), cobalt (Co), copper (Cu), palladium (Pd), nitride of metal materials (e.g., TiN), and the like can be used.

Meanwhile, for the second electrode, preferably, metal, alloy, an electrically conductive compound, and a mixture of these materials having a low work function (3.8 eV or lower) are used. Specifically, transition metal containing rare earth metal in addition to an element in Group 1 or 2 of the periodic table, namely, alkali metal such as Li or Cs, and alkaline earth metal such as Mg, Ca, or Sr, alloy of these elements (Mg:Ag, Al:Li), and compounds (LiF, CsF, CaF2) can be used. It is to be noted that, since the second electrode has a light-transmitting property, the metal or alloy containing the above metal are formed to be quite thin and stacked with metal (including alloy) such as ITO.

The first electrode and the second electrode can be formed by an evaporation method, a sputtering method, or the like.

Either the first electrode or the second electrode may serve as an anode or a cathode depending on a pixel configuration. For example, polarity of the driving transistor may be an n-channel type, the first electrode thereof may serve as a cathode, and the second electrode thereof may serve as an anode.

Thereafter, a passivation film 2814 containing nitrogen is formed by a sputtering method or a CVD method, thereby blocking moisture and oxygen. Space formed at this time may be filled with nitrogen and sealed, and a drying agent may be further disposed inside the space. Alternatively, the space may be filled with a light-transmitting resin having a high water absorption property. Further, the side surfaces of display means may be covered with the first electrode, the second electrode, and other electrode in order to block out moisture and oxygen. Then, a sealing substrate 2815 is attached thereto.

A polarizing plate or a circular polarizing plate may be provided in order to enhance contrast. For example, a polarizing plate or a circular polarizing plate may be provided on either of display surfaces or both display surfaces.

In a display device including such a sub-pixel formed as described above, the first electrode 2811 and the second electrode 2813 have a light-transmitting property. Therefore, light from a light-emitting element can be emitted in both directions shown by arrows at luminance corresponding to a video signal inputted from a signal line.

In the display device shown in FIG. 28A, in which the area gradation display is achieved by making differences between light-emission areas of the sub-pixels each including a light-emitting element, that is, making differences between areas of transparent conductive films, and in which light is emitted in both directions, a transparent conductive film can be designed larger. Accordingly, transmittance can be increased when the light-emitting element emits no light, which is preferable.

In FIG. 28B, light is emitted only in the direction of the sealing substrate 2815. Therefore, the first electrode 2811 is formed of a conductive film having no light-transmitting property, and preferably, having high reflectivity. Meanwhile, the second electrode 2813 is formed of a conductive film having a light-transmitting property. Other structure is the same as that shown in FIG. 28A, and description thereof is thus omitted herein.

In FIG. 28C, light is emitted only in the direction of the substrate 2800. Therefore, the first electrode 2811 is formed of a conductive film having a light-transmitting property, whereas the second electrode 2813 is formed of a conductive film having no light-transmitting property, and preferably, having high reflectivity. Other structure is the same as that shown in FIG. 28A, and description thereof is thus omitted herein.

When a highly reflective conductive film is used for the electrode of the light-emitting element, to which light is not emitted, as shown in FIGS. 28B and 28C, light can be utilized effectively.

In this embodiment, in order to obtain a conductive film having a light-transmitting property, a conductive film having no light-transmitting property is formed thin enough to have a light-transmitting property, and a conductive film having a light-transmitting property may be formed thereover.

In accordance with this embodiment, variations in luminance due to variations in current value of a light-emitting element, which are caused by an environmental temperature change and a change with time, can be suppressed. Further, since it is not necessary to provide a monitoring element into the same size as that of a pixel in a display portion, the monitoring element can be downsized. In addition, by downsizing the monitoring element, downsizing of a display device, in other words, a narrow frame of the display device, in which light is emitted to the substrate side or the sealing substrate side, or both the substrate side and the sealing substrate side, can be achieved.

It is to be noted that this embodiment can be implemented by being freely combined with any description of embodiments and embodiment modes in this specification.

Embodiment 5

This embodiment will describe structural examples of electronic apparatuses each having a display device according to the present invention in a display portion.

The display device provided with a pixel region including a light-emitting element can be applied to various electronic apparatuses such as a television device (a television or a television receiver), a camera such as a digital camera or a digital video camera, a cellular phone, a portable information terminal such as a PDA, a portable game machine, a monitor, a computer, a sound reproducing device such as an in-car audio system, an image reproducing device provided with a recording medium, such as a home video game player, and the like. The display device according to the present invention can be applied to a display portion of these electronic apparatuses. Specific examples of these electronic apparatuses are shown in FIGS. 29A to 29F.

Figure 29A:
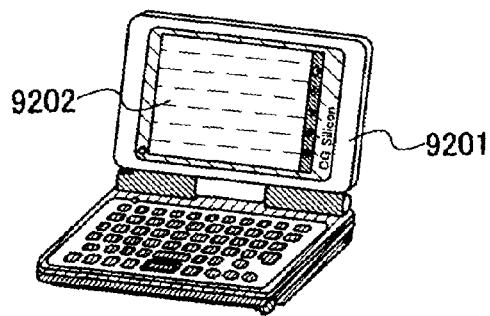
FIGS. 29A to 29F are views each showing an electronic apparatus according to Embodiment 5 of the present invention.
Figure 29B:
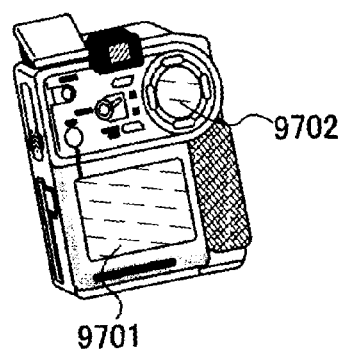
Figure 29C:
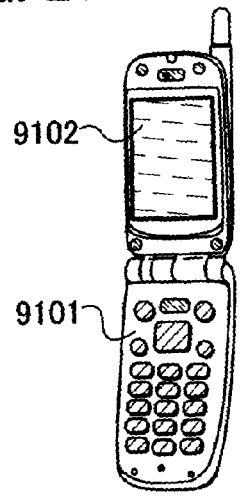
Figure 29D:
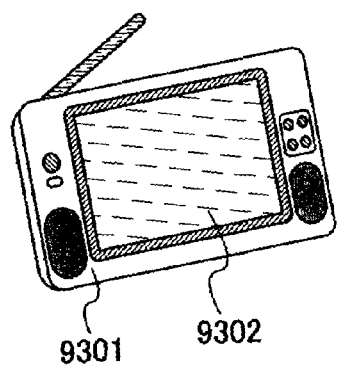
Figure 29E:
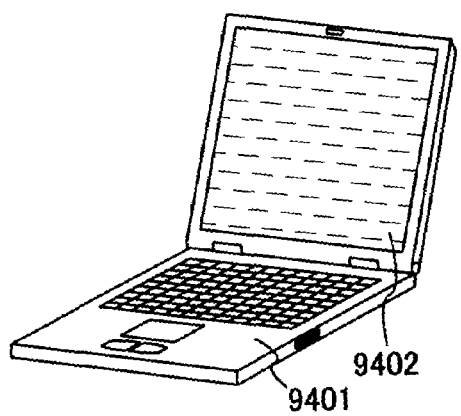
Figure 29F:
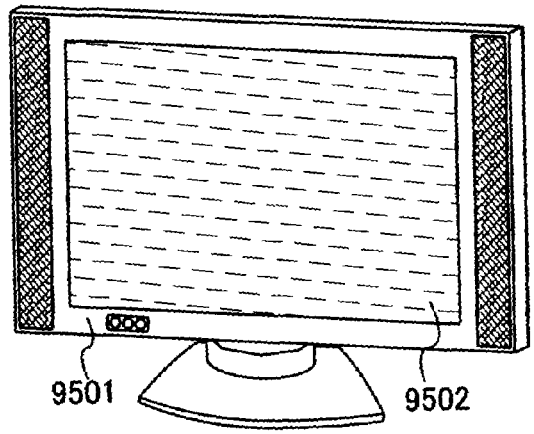
Figure 30A:
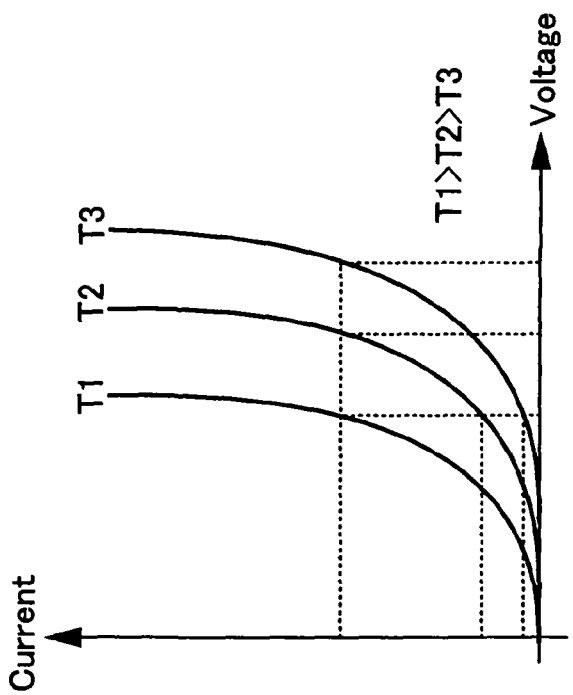
FIGS. 30A and 30B are graphs each explaining a conventional example of the present invention.
Figure 30B:
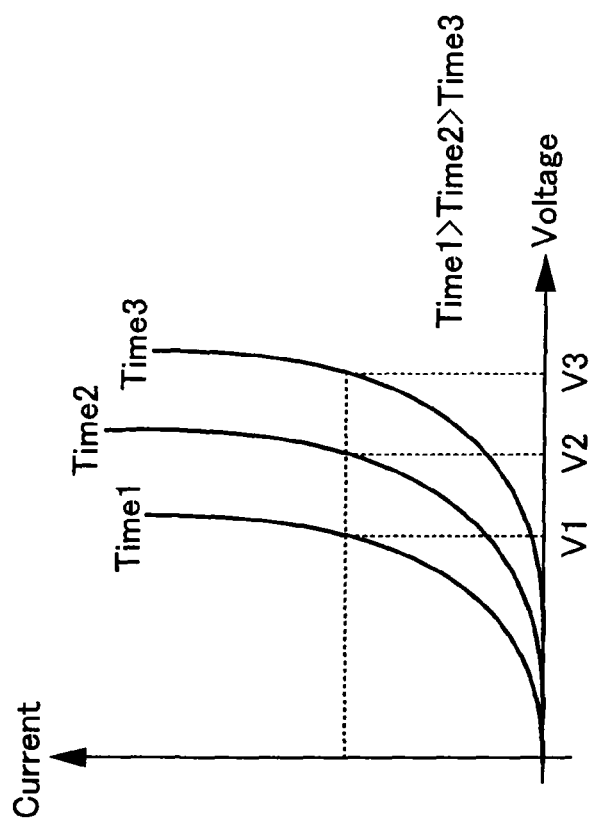

FIG. 29A shows a portable information terminal using the display device according to the present invention, which includes a main body 9201, a display portion 9202, and the like. In the portable information terminal, power consumption can be reduced and the display device portion can be downsized in accordance with the present invention. FIG. 29B shows a digital video camera using the display device according to the present invention, which includes display portions 9701 and 9702, and the like. In the digital video camera, power consumption can be reduced and the display device portion can be downsized in accordance with the present invention. FIG. 29C shows a portable terminal using the display device according to the present invention, which includes a main body 9101, a display portion 9102, and the like. In the portable terminal, power consumption can be reduced and the display device portion can be downsized in accordance with the present invention. FIG. 29D shows a portable television device using the display device according to the present invention, which includes a main body 9301, a display portion 9302, and the like. In the portable television device, power consumption can be reduced and the display device portion can be downsized in accordance with the present invention. FIG. 29E shows a portable computer using the display device according to the present invention, which includes a main body 9401, a display portion 9402, and the like. In the portable computer, power consumption can be reduced and the display device portion can be downsized in accordance with the present invention. FIG. 29F shows a television device using the display device according to the present invention, which includes a main body 9501, a display portion 9502, and the like. In the television device, power consumption can be reduced and the display device portion can be downsized in accordance with the present invention.

It is to be noted that this embodiment can be implemented by being freely combined with any description of embodiments and embodiment modes in this specification.

A driving method of a display device having a compensation function as in the present invention can be called a constant luminance driving method (a constant brightness method, a constant luminescence method, a brightness control method, a control brightness method, or a bright control method). In such a driving method, an increase of a current value due to the compensation function and a decrease of the current value due to a change with time are obtained in advance, and the light-emitting element is driven under a voltage condition so that the increase and the decrease are canceled.

This application is based on Japanese Patent Application serial no. 2005-303747 filed in Japan Patent Office on Oct. 18, 2005, the entire contents of which are hereby incorporated by reference.

What is claimed is:

1. A display device comprising:
a pixel comprising at least a first sub-pixel and a second sub-pixel, the first sub-pixel comprising a first light-emitting element and a first transistor, the second sub-pixel comprising a second light-emitting element and a second transistor, each of the first light-emitting element and the second light-emitting element comprising a first electrode and a second electrode;
a monitoring element comprising a first electrode and a second electrode;
a current source supplying a current to the monitoring element; and
a buffer amplifier,
wherein the first electrode of the monitoring element and the first electrodes of both the first light-emitting element and the second light-emitting element are connected to a power supply line;
wherein the second electrode of the monitoring element is connected to an input terminal of the buffer amplifier, the second electrode of the first light-emitting element is connected to an output terminal of the buffer amplifier through the first transistor, and the second electrode of the second light-emitting element is connected to the output terminal of the buffer amplifier through the second transistor;
wherein areas of the first light-emitting element and the second light-emitting element are different from each other; and
wherein most of an area of the monitoring element is the same as an area of one of the first light-emitting element and the second light-emitting element.

2. A display device comprising:
a pixel comprising at least a first sub-pixel and a second sub-pixel, the first sub-pixel comprising a first light-emitting element and a first transistor, the second sub-pixel comprising a second light-emitting element and a second transistor, each of the first light-emitting element and the second light-emitting element comprising a first electrode and a second electrode;
a monitoring element comprising a first electrode and a second electrode;
a current source supplying a current to the monitoring element;
a capacitor element holding a potential of the second electrode of the monitoring element;
a first switch disposed between the capacitor element and the current source;
a second switch disposed between the current source and the monitoring element; and
a buffer amplifier,
wherein the first electrode of the monitoring element and the first electrodes of both the first light-emitting element and the second light-emitting element are connected to a power supply line;
wherein the second electrode of the monitoring element is connected to an input terminal of the buffer amplifier, the second electrode of the first light-emitting element is connected to an output terminal of the buffer amplifier through the first transistor, and the second electrode of the second light-emitting element is connected to the output terminal of the buffer amplifier through the second transistor;
wherein areas of the first light-emitting element and the second light-emitting element are different from each other; and
wherein most of an area of the monitoring element is the same as an area of one of the first light-emitting element and the second light-emitting element.

3. A display device comprising:
a pixel comprising at least a first sub-pixel and a second sub-pixel, the first sub-pixel comprising a first light-emitting element and a first transistor, the second sub-pixel comprising a second light-emitting element and a second transistor, each of the first light-emitting element and the second light-emitting element comprising a first electrode and a second electrode;
a monitoring element comprising a first electrode and a second electrode;
a current source supplying a current to the monitoring element; and
a buffer amplifier, wherein the first electrode of the monitoring element and the first electrodes of both the first light-emitting element and the second light-emitting element are connected to a power supply line;

wherein the second electrode of the monitoring element is connected to an input terminal of the buffer amplifier, the second electrode of the first light-emitting element is connected to an output terminal of the buffer amplifier through the first transistor, and the second electrode of the second light-emitting element is connected to the output terminal of the buffer amplifier through the second transistor;

wherein areas of the first light-emitting element and the second light-emitting element are related by a geometric progression with a geometric ratio 2;

wherein most of an area of the monitoring element is the same as an area of the first light-emitting element; and wherein the area of the first light-emitting element is smaller than an area of the second light-emitting element.

4. A display device comprising:

a pixel comprising at least a first sub-pixel and a second sub-pixel, the first sub-pixel comprising a first light-emitting element and a first transistor, the second sub-pixel comprising a second light-emitting element and a second transistor, each of the first light-emitting element and the second light-emitting element comprising a first electrode and a second electrode;

a monitoring element comprising a first electrode and a second electrode;

a current source supplying a current to the monitoring element;

a capacitor element holding a potential of the second electrode of the monitoring element;

a first switch disposed between the capacitor element and the current source;

a second switch disposed between the current source and the monitoring element; and a buffer amplifier, wherein the first electrode of the monitoring element and the first electrodes of both the first light-emitting element and the second light-emitting element are connected to a power supply line;

wherein the second electrode of the monitoring element is connected to an input terminal of the buffer amplifier, the second electrode of the first light-emitting element is connected to an output terminal of the buffer amplifier through the first transistor, and the second electrode of the second light-emitting element is connected to the output terminal of the buffer amplifier through the second transistor;

wherein areas of the first light-emitting element and the second light-emitting element are different from each other;

wherein most of an area of the monitoring element is the same as an area of the first light-emitting element; and wherein the area of the first light-emitting element is smaller than an area of the second light-emitting element.

5. A display device comprising:

a pixel comprising at least a first sub-pixel and a second sub-pixel, the first sub-pixel comprising a first light-emitting element and a first transistor, the second sub-pixel comprising a second light-emitting element and a second transistor, each of the first light-emitting element and the second light-emitting element comprising a first electrode and a second electrode;

a monitoring element comprising a first electrode and a second electrode;

a current source supplying a current to the monitoring element; and a buffer amplifier, wherein the first electrode of the monitoring element and the first electrodes of both the first light-emitting element and the second light-emitting element are connected to a power supply line;

wherein the second electrode of the monitoring element is connected to an input terminal of the buffer amplifier, the second electrode of the first light-emitting element is connected to an output terminal of the buffer amplifier through the first transistor, and the second electrode of the second light-emitting element is connected to the output terminal of the buffer amplifier through the second transistor;

wherein light-emission intensities of the first light-emitting element and the second light-emitting element are different from each other; and wherein a light-emission intensity of the monitoring element is substantially equal to a light-emission intensity of one of the first light-emitting element and the second light-emitting element.

6. A display device comprising:

a pixel comprising at least a first sub-pixel and a second sub-pixel, the first sub-pixel comprising a first light-emitting element and a first transistor, the second sub-pixel comprising a second light-emitting element and a second transistor, each of the first light-emitting element and the second light-emitting element comprising a first electrode and a second electrode;

a monitoring element comprising a first electrode and a second electrode;

a current source supplying a current to the monitoring element;

a capacitor element holding a potential of the second electrode of the monitoring element;

a first switch disposed between the capacitor element and the current source;

a second switch disposed between the current source and the monitoring element; and a buffer amplifier, wherein the first electrode of the monitoring element and the first electrodes of both the first light-emitting element and the second light-emitting element are connected to a power supply line;

wherein the second electrode of the monitoring element is connected to an input terminal of the buffer amplifier, the second electrode of the first light-emitting element is connected to an output terminal of the buffer amplifier through the first transistor, and the second electrode of the second light-emitting element is connected to the output terminal of the buffer amplifier through the second transistor;

wherein light-emission intensities of the first light-emitting element and the second light-emitting element are different from each other; and wherein a light-emission intensity of the monitoring element substantially equal to a light-emission intensity of one of the first light-emitting element and the second light-emitting element.

7. A display device comprising:

a pixel comprising at least a first sub-pixel and a second sub-pixel, the first sub-pixel comprising a first light-emitting element and a first transistor, the second sub-pixel comprising a second light-emitting element and a second transistor, each of the first light-emitting element and the second light-emitting element comprising a first electrode and a second electrode;

a monitoring element comprising a first electrode and a second electrode;

a current source supplying a current to the monitoring element; and a buffer amplifier, wherein the first electrode of the monitoring element and the first electrodes of both the first light-emitting element and the second light-emitting element are connected to a power supply line;

wherein the second electrode of the monitoring element is connected to an input terminal of the buffer amplifier, the second electrode of the first light-emitting element is connected to an output terminal of the buffer amplifier through the first transistor, and the second electrode of the second light-emitting element is connected to the output terminal of the buffer amplifier through the second transistor;

wherein, light-emission intensities of the first light-emitting element and the second light-emitting element are related by a geometric progression with a geometric ratio 2;

wherein a light-emission intensity of the monitoring element substantially equal to a light-emission intensity of the first light-emitting element; and wherein the light-emission intensity of the first light-emitting element is lower than a light-emission intensity of the second light-emitting element.

8. A display device comprising:

a pixel comprising at least a first sub-pixel and a second sub-pixel, the first sub-pixel comprising a first light-emitting element and a first transistor, the second sub-pixel comprising a second light-emitting element and a second transistor, each of the first light-emitting element and the second light-emitting element comprising a first electrode and a second electrode;

a monitoring element comprising a first electrode and a second electrode;

a current source supplying a current to the monitoring element;

a capacitor element holding a potential of the second electrode of the monitoring element;

a first switch disposed between the capacitor element and the current source;

a second switch disposed between the current source and the monitoring element; and a buffer amplifier, wherein the first electrode of the monitoring element and the first electrodes of both the first light-emitting element and the second light-emitting element are connected to a power supply line;

wherein the second electrode of the monitoring element is connected to an input terminal of the buffer amplifier, the second electrode of the first light-emitting element is connected to an output terminal of the buffer amplifier through the first transistor, and the second electrode of the second light-emitting element is connected to the output terminal of the buffer amplifier through the second transistor;

wherein light-emission intensities of the first light-emitting element and the second light-emitting element are different from each other;

wherein a light-emission intensity of the monitoring element substantially equal to a light-emission intensity of the first light-emitting element; and wherein the light-emission intensity of the first light-emitting element is lower than a light-emission intensity of the second light-emitting element.

9. An electronic apparatus comprising the display device according to any one of claims 1 to 8 in a display portion.

10. A display device according to claim 1, wherein a difference between the area of the monitoring element and the area of one of the first light-emitting element and the second light-emitting element is equal to or less than 20% of the area of the monitoring element.

11. A display device according to claim 1, wherein the area of the monitoring element and the area of one of the first light-emitting element and the second light-emitting element are completely the same.

12. A display device according to claim 10, wherein the difference between the area of the monitoring element and the area of one of the first light-emitting element and the second light-emitting element is equal to or less than 5% of the area of the monitoring element.

* * * * *